(12) United States Patent  
Lee et al.

(10) Patent No.: US 9,128,632 B2  
(45) Date of Patent: Sep. 8, 2015

(54) MEMORY MODULE WITH DISTRIBUTED DATA BUFFERS AND METHOD OF OPERATION

(71) Applicant: Netlist, Inc., Irvine, CA (US)

(72) Inventors: Hyun Lee, Ladera Ranch, CA (US); Jayesh R. Bhakta, Cerritos, CA (US)

(73) Assignee: Netlist, Inc., Irvine, CA (US)

( * ) Notice: Subject to any disclaimer, the term of this patent is extended or adjusted under 35 U.S.C. 154(b) by 0 days.

(21) Appl. No.: 13/952,599

(22) Filed: Jul. 27, 2013

(65) Prior Publication Data

US 2014/0337539 A1    Nov. 13, 2014

Related U.S. Application Data

(60) Provisional application No. 61/676,883, filed on Jul. 27, 2012.

(51) Int. Cl.
| | |
|---|---|
| G06F 3/00 | (2006.01) |
| G06F 12/00 | (2006.01) |
| G06F 13/00 | (2006.01) |
| G06F 3/06 | (2006.01) |

(52) U.S. Cl.
    CPC ................................ *G06F 3/0659* (2013.01)

(58) Field of Classification Search
    None
    See application file for complete search history.

(56) References Cited

U.S. PATENT DOCUMENTS

| | | | |
|---|---|---|---|
| 4,218,740 A | 8/1980 | Bennett et al. | |
| 4,249,253 A | 2/1981 | Gentili et al. | |
| 4,368,515 A | 1/1983 | Nielsen | |
| 4,392,212 A | 7/1983 | Miyasaka et al. | |
| 4,571,676 A | 2/1986 | Mantellina et al. | |
| 4,592,011 A | 5/1986 | Mantellina et al. | |
| 4,633,429 A | 12/1986 | Lewandowski et al. | |

(Continued)

FOREIGN PATENT DOCUMENTS

| | | |
|---|---|---|
| EP | 1816570 A2 | 8/2007 |
| JP | 09237492 | 9/1997 |

(Continued)

OTHER PUBLICATIONS

US 6,832,284, 12/2004, Perego et al. (withdrawn).

(Continued)

*Primary Examiner* — Michael Sun  
(74) *Attorney, Agent, or Firm* — Jamie J. Zheng, Esq.

(57) ABSTRACT

A memory module is operatable in a memory system with a memory controller. The memory module comprises a module control device to receive command signals from the memory controller and to output module command signals and module control signals. The module command signals are provided to memory devices organized in groups, each group including at least one memory device, while the module control signals are provided to a plurality of buffer circuits to control data paths in the buffer circuits. The plurality of buffer circuits are associated with respective groups of memory devices and are distributed across a surface of the memory module such that each module control signal arrives at the plurality of buffer circuits at different points in time. The plurality of buffer circuits are configured to align read data signals received from the memory devices such that the read data signals are transmitted to the memory controller from the memory module substantially aligned with each other and in accordance with a read latency parameter of the memory system.

20 Claims, 26 Drawing Sheets

(56) References Cited

U.S. PATENT DOCUMENTS

| | | | |
|---|---|---|---|
| 4,670,748 A | 6/1987 | Williams |
| 4,706,214 A | 11/1987 | Kassai |
| 4,866,603 A | 9/1989 | Chiba |
| 4,958,322 A | 9/1990 | Kosugi et al. |
| 4,961,172 A | 10/1990 | Shubat et al. |
| 4,961,204 A | 10/1990 | Tanaka et al. |
| 4,980,850 A | 12/1990 | Morgan |
| 5,060,188 A | 10/1991 | Zulian et al. |
| 5,247,643 A | 9/1993 | Shottan |
| 5,272,664 A | 12/1993 | Alexander et al. |
| 5,345,412 A | 9/1994 | Shiratsuchi |
| 5,357,478 A | 10/1994 | Kikuda et al. |
| 5,388,072 A | 2/1995 | Matick et al. |
| 5,388,240 A | 2/1995 | Olderdissen et al. |
| 5,392,252 A | 2/1995 | Rimpo et al. |
| 5,426,753 A | 6/1995 | Moon |
| 5,463,590 A | 10/1995 | Watanabe |
| 5,483,497 A | 1/1996 | Mochizuki et al. |
| 5,485,589 A | 1/1996 | Kocis et al. |
| 5,495,435 A | 2/1996 | Sugahara |
| 5,513,135 A | 4/1996 | Dell et al. |
| 5,532,954 A | 7/1996 | Bechtolsheim et al. |
| 5,541,448 A | 7/1996 | Carpenter |
| 5,572,691 A | 11/1996 | Koudmani |
| 5,581,498 A | 12/1996 | Ludwig et al. |
| 5,590,071 A | 12/1996 | Kolor et al. |
| 5,602,999 A | 2/1997 | Hyatt |
| 5,638,534 A | 6/1997 | Mote, Jr. |
| 5,655,153 A | 8/1997 | Sandorfi |
| 5,699,542 A | 12/1997 | Mehta et al. |
| 5,702,984 A | 12/1997 | Bertin et al. |
| 5,703,826 A | 12/1997 | Hush et al. |
| 5,745,914 A | 4/1998 | Connolly et al. |
| 5,764,590 A | 6/1998 | Iwamoto et al. |
| 5,784,705 A | 7/1998 | Leung |
| 5,802,395 A | 9/1998 | Connolly et al. |
| 5,805,520 A | 9/1998 | Anglada et al. |
| 5,822,251 A | 10/1998 | Bruce et al. |
| RE36,229 E | 6/1999 | Cady |
| 5,909,388 A | 6/1999 | Mueller |
| 5,926,827 A | 7/1999 | Dell et al. |
| 5,926,839 A | 7/1999 | Katayama |
| 5,953,215 A | 9/1999 | Karabatsos |
| 5,953,280 A | 9/1999 | Matsui |
| 5,958,025 A | 9/1999 | Sonobe |
| 5,959,930 A | 9/1999 | Sakurai |
| 5,963,464 A | 10/1999 | Dell et al. |
| 5,966,736 A | 10/1999 | Gittinger et al. |
| 5,974,493 A | 10/1999 | Okumura et al. |
| 6,011,710 A | 1/2000 | Wiggers |
| 6,018,787 A | 1/2000 | Ip |
| 6,044,032 A | 3/2000 | Li |
| 6,070,217 A | 5/2000 | Connolly et al. |
| 6,070,227 A | 5/2000 | Rokicki |
| 6,097,652 A | 8/2000 | Roh |
| 6,108,745 A | 8/2000 | Gupta et al. |
| 6,115,278 A | 9/2000 | Deneroff et al. |
| 6,134,638 A | 10/2000 | Olarig et al. |
| 6,151,271 A | 11/2000 | Lee |
| 6,154,418 A | 11/2000 | Li |
| 6,154,419 A | 11/2000 | Shakkarwar |
| 6,185,654 B1 | 2/2001 | Van Doren |
| 6,188,641 B1 | 2/2001 | Uchida |
| 6,205,516 B1 | 3/2001 | Usami |
| 6,209,074 B1 | 3/2001 | Dell et al. |
| 6,226,709 B1 | 5/2001 | Goodwin et al. |
| 6,226,736 B1 | 5/2001 | Niot |
| 6,233,650 B1 | 5/2001 | Johnson et al. |
| 6,247,088 B1 | 6/2001 | Seo et al. |
| 6,317,352 B1 | 11/2001 | Halbert et al. |
| 6,349,051 B1 | 2/2002 | Klein |
| 6,400,637 B1 | 6/2002 | Akamatsu et al. |
| 6,408,356 B1 | 6/2002 | Dell |
| 6,414,868 B1 | 7/2002 | Wong et al. |
| 6,415,374 B1 | 7/2002 | Faue et al. |
| 6,438,062 B1 | 8/2002 | Curtis et al. |
| 6,446,158 B1 | 9/2002 | Karabatsos |
| 6,446,184 B2 | 9/2002 | Dell et al. |
| 6,453,381 B1 | 9/2002 | Yuan et al. |
| 6,470,417 B1 | 10/2002 | Kolor et al. |
| 6,480,439 B2 | 11/2002 | Tokutome et al. |
| 6,487,102 B1 | 11/2002 | Halbert et al. |
| 6,502,161 B1 | 12/2002 | Perego et al. |
| 6,518,794 B2 | 2/2003 | Coteus et al. |
| 6,526,473 B1 | 2/2003 | Kim |
| 6,530,007 B2 | 3/2003 | Olarig et al. |
| 6,530,033 B1 | 3/2003 | Raynham et al. |
| 6,553,450 B1 | 4/2003 | Dodd et al. |
| 6,618,320 B2 | 9/2003 | Hasegawa et al. |
| 6,621,496 B1 | 9/2003 | Ryan |
| 6,625,081 B2 | 9/2003 | Roohparvar et al. |
| 6,625,687 B1 | 9/2003 | Halbert et al. |
| 6,636,935 B1 | 10/2003 | Ware et al. |
| 6,646,949 B1 | 11/2003 | Ellis et al. |
| 6,658,509 B1 | 12/2003 | Bonella et al. |
| 6,674,684 B1 | 1/2004 | Shen |
| 6,681,301 B1 | 1/2004 | Mehta et al. |
| 6,683,372 B1 | 1/2004 | Wong et al. |
| 6,697,888 B1 | 2/2004 | Halbert et al. |
| 6,705,877 B1 | 3/2004 | Li et al. |
| 6,717,885 B2 | 4/2004 | Lai |
| 6,721,843 B1 | 4/2004 | Estakhri |
| 6,721,860 B2 | 4/2004 | Klein |
| 6,738,880 B2 | 5/2004 | Lai et al. |
| 6,742,098 B1 | 5/2004 | Halbert et al. |
| 6,754,746 B1 * | 6/2004 | Leung et al. .................. 710/100 |
| 6,754,797 B2 | 6/2004 | Wu et al. |
| 6,785,189 B2 | 8/2004 | Jacobs et al. |
| 6,788,592 B2 | 9/2004 | Nakata et al. |
| 6,799,252 B1 * | 9/2004 | Bauman ........................ 711/149 |
| 6,807,125 B2 | 10/2004 | Coteus et al. |
| 6,807,650 B2 | 10/2004 | Lamb et al. |
| 6,813,196 B2 | 11/2004 | Park et al. |
| 6,832,303 B2 | 12/2004 | Tanaka |
| 6,834,014 B2 | 12/2004 | Yoo et al. |
| 6,854,042 B1 | 2/2005 | Karabatsos |
| 6,880,094 B2 | 4/2005 | LaBerge |
| 6,889,304 B2 | 5/2005 | Perego et al. |
| 6,912,615 B2 | 6/2005 | Nicolai |
| 6,912,628 B2 | 6/2005 | Wicki et al. |
| 6,925,028 B2 | 8/2005 | Hosokawa et al. |
| 6,944,694 B2 | 9/2005 | Pax |
| 6,950,366 B1 | 9/2005 | Lapidus et al. |
| 6,954,281 B2 | 10/2005 | Fukuda et al. |
| 6,961,281 B2 | 11/2005 | Wong et al. |
| 6,981,089 B2 | 12/2005 | Dodd et al. |
| 6,982,892 B2 | 1/2006 | Lee et al. |
| 6,982,893 B2 | 1/2006 | Jakobs |
| 6,990,043 B2 | 1/2006 | Kuroda et al. |
| 6,996,686 B2 | 2/2006 | Doblar et al. |
| 7,007,130 B1 | 2/2006 | Holman |
| 7,007,175 B2 | 2/2006 | Chang et al. |
| 7,046,538 B2 | 5/2006 | Kinsley et al. |
| 7,047,361 B2 | 5/2006 | Chong et al. |
| 7,054,179 B2 | 5/2006 | Cogdill et al. |
| 7,065,626 B2 | 6/2006 | Schumacher et al. |
| 7,072,231 B2 | 7/2006 | Pax |
| 7,073,041 B2 | 7/2006 | Dwyer et al. |
| 7,078,793 B2 | 7/2006 | Ruckerbauer et al. |
| 7,093,066 B2 | 8/2006 | Klein |
| 7,120,727 B2 | 10/2006 | Lee et al. |
| 7,124,260 B2 | 10/2006 | LaBerge et al. |
| 7,127,584 B1 | 10/2006 | Thompson et al. |
| 7,130,952 B2 | 10/2006 | Nanki et al. |
| 7,133,960 B1 | 11/2006 | Thompson et al. |
| 7,133,972 B2 | 11/2006 | Jeddeloh |
| 7,142,461 B2 | 11/2006 | Janzen |
| 7,149,841 B2 | 12/2006 | LaBerge |
| 7,167,967 B2 | 1/2007 | Bungo et al. |
| 7,181,591 B2 | 2/2007 | Tsai |
| 7,200,021 B2 | 4/2007 | Raghuram |
| 7,227,910 B2 | 6/2007 | Lipka |
| 7,266,639 B2 | 9/2007 | Raghuram |
| 7,272,709 B2 | 9/2007 | Zitlaw et al. |

(56) References Cited

U.S. PATENT DOCUMENTS

| | | | |
|---|---|---|---|
| 7,281,079 | B2 | 10/2007 | Bains et al. |
| 7,286,436 | B2 | 10/2007 | Bhakta et al. |
| 7,289,386 | B2 | 10/2007 | Bhakta et al. |
| 7,346,750 | B2 | 3/2008 | Ishikawa |
| 7,356,639 | B2 | 4/2008 | Perego et al. |
| 7,370,238 | B2 | 5/2008 | Billick et al. |
| 7,437,591 | B1 | 10/2008 | Wong |
| 7,461,182 | B2 | 12/2008 | Fukushima et al. |
| 7,464,225 | B2* | 12/2008 | Tsern ............................ 711/115 |
| 7,471,538 | B2 | 12/2008 | Hofstra |
| 7,532,537 | B2 | 5/2009 | Solomon et al. |
| 7,619,912 | B2 | 11/2009 | Bhakta et al. |
| 7,636,274 | B2 | 12/2009 | Solomon et al. |
| 7,864,627 | B2 | 1/2011 | Bhakta et al. |
| 7,865,674 | B2 | 1/2011 | Gower et al. |
| 7,881,150 | B2 | 2/2011 | Solomon et al. |
| 7,884,619 | B1* | 2/2011 | Chong et al. .................. 324/601 |
| 7,916,574 | B1 | 3/2011 | Solomon et al. |
| 8,001,434 | B1 | 8/2011 | Lee et al. |
| 8,089,795 | B2 | 1/2012 | Rajan |
| 8,130,560 | B1 | 3/2012 | Rajan |
| 8,189,328 | B2 | 5/2012 | Kanapathippillai |
| 8,214,616 | B2* | 7/2012 | Ware et al. ..................... 711/167 |
| 8,233,303 | B2 | 7/2012 | Best |
| 8,250,295 | B2 | 8/2012 | Amidi et al. |
| 8,417,870 | B2 | 4/2013 | Lee et al. |
| 8,516,185 | B2 | 8/2013 | Lee et al. |
| 8,516,188 | B1 | 8/2013 | Solomon et al. |
| 8,565,033 | B1* | 10/2013 | Manohararajah et al. .... 365/193 |
| 8,756,364 | B1 | 6/2014 | Bhakta et al. |
| 8,949,519 | B2* | 2/2015 | Rajan et al. ................... 711/105 |
| 2001/0008006 | A1 | 7/2001 | Klein |
| 2002/0039323 | A1* | 4/2002 | Tokutome et al. ............ 365/233 |
| 2004/0105292 | A1* | 6/2004 | Matsui ............................ 365/63 |
| 2005/0257109 | A1 | 11/2005 | Averbuj |
| 2006/0179206 | A1 | 8/2006 | Brittain et al. |
| 2006/0233012 | A1 | 10/2006 | Sekiguchi et al. |
| 2006/0259711 | A1 | 11/2006 | Oh |
| 2006/0267172 | A1 | 11/2006 | Nguyen et al. |
| 2006/0277355 | A1 | 12/2006 | Ellsberry et al. |
| 2007/0058409 | A1 | 3/2007 | Ruckerbauer |
| 2007/0064462 | A1* | 3/2007 | Matsui ............................ 365/63 |
| 2007/0070669 | A1 | 3/2007 | Tsern |
| 2008/0025137 | A1 | 1/2008 | Rajan et al. |
| 2008/0037412 | A1* | 2/2008 | Geile et al. ..................... 370/208 |
| 2008/0046631 | A1 | 2/2008 | Takaku et al. |
| 2008/0104352 | A1 | 5/2008 | Talbot |
| 2008/0162790 | A1 | 7/2008 | Im |
| 2009/0103387 | A1 | 4/2009 | Shau |
| 2009/0198924 | A1* | 8/2009 | Shaeffer et al. ............... 711/154 |
| 2010/0070690 | A1 | 3/2010 | Amer et al. |
| 2010/0091540 | A1 | 4/2010 | Bhakta et al. |
| 2010/0228891 | A1* | 9/2010 | Talbot ............................ 710/14 |
| 2011/0016250 | A1 | 1/2011 | Lee et al. |
| 2011/0016269 | A1 | 1/2011 | Lee et al. |
| 2011/0090749 | A1 | 4/2011 | Bhakta et al. |
| 2011/0125966 | A1 | 5/2011 | Amidi et al. |
| 2012/0256639 | A1* | 10/2012 | Pausini et al. ................. 324/613 |

FOREIGN PATENT DOCUMENTS

| | | |
|---|---|---|
| JP | 10-092169 | 10/1998 |
| JP | H10-320270 | 12/1998 |
| JP | 2000285674 | 10/2000 |
| JP | 2000311485 | 10/2000 |
| JP | 2002184176 | 6/2002 |
| JP | 2003007963 | 1/2003 |
| JP | 2008046989 | 2/2008 |
| WO | WO92/02879 | 2/1992 |
| WO | WO94/07242 | 3/1994 |
| WO | WO95/34030 | 12/1995 |
| WO | WO99/00734 | 1/1999 |
| WO | WO02/058069 | 7/2002 |
| WO | WO02/063804 | 8/2002 |
| WO | WO03/017283 | 2/2003 |
| WO | WO03/069484 | 8/2003 |
| WO | WO2006/055497 | 5/2006 |

OTHER PUBLICATIONS

International Search Report and Written Opinion, PCT/US2010/040826, Sep. 27, 2010.
Written Opinion of the International Preliminary Examining Authority, PCT/US2010/040826, Oct. 24, 2011.
International Preliminary Report on Patentability, PCT/US2010/040826, Nov. 28, 2011.
International Search Report and Written Opinion, PCT/US2011/059209, Jan. 30, 2013.
Notice of Allowance issued on Feb. 12, 2013, for U.S. Appl. No. 12/504,131, filed Jul. 16, 2009, 52 pages.
Non-Final Office Action mailed Sep. 13, 2012, for U.S. Appl. No. 12/761,179, filed Apr. 15, 2010, 20 pages.
Response to Non-Final Office Action mailed Sep. 13, 2012, for U.S. Appl. No. 12/761,179, filed Mar. 13, 2013, 16 pages.
Notice of Allowance issued on Jul. 11, 2013, for U.S. Appl. No. 12/761,179, filed Apr. 15, 2010, 37 pages.
*Inter Partes* Review Case No. IPR2014-01029, Petition for *Inter Partes* Review of U.S. Patent No. 8,516,185, filed on Jun. 24, 2014.
*Inter Partes* Review Case No. IPR2014-01029, Exhibit 1008 to Petition for *Inter Partes* Review, "Declaration of Charles J. Neuhauser, Ph.D. under 37 C.F.R. § 1.68," filed on Jun. 24, 2014.
*Inter Partes* Review Case No. IPR2014-01029, Supplemental Petition for *Inter Partes* Review of U.S. Patent No. 8,516,185, filed on Jul. 23, 2014.
*Inter Partes* Review Case No. IPR2014-01029, Patent Owner's Preliminary Response pursuant to 37 C.F.R. § 42.107, filed on Oct. 17, 2014.
*Inter Partes* Review Case No. IPR2014-01029, Decision Denying Institution of *Inter Partes* Review 37 C.F.R. § 42.108, issued Dec. 16, 2014.
U.S. Appl. No. 13/411,344, filed Mar. 2, 2012, Lee.
U.S. Appl. No. 13/970,606, filed Aug. 20, 2013, Netlist, Inc.
U.S. Appl. No. 13/971,231, filed Aug. 20, 2013, Netlist, Inc.
U.S. Appl. No. 14/229,844, filed Mar. 29, 2014, Netlist, Inc.
U.S. Appl. No. 14/324,990, filed Jul. 7, 2014, Netlist, Inc.
U.S. Appl. No. 14/337,168, filed Jul. 21, 2014, Netlist, Inc.
*Inter Partes* Review Case No. IPR2014-01369, Corrected Petition for *Inter Partes* Review of Claims 1-19 of U.S. Patent No. 8,516,185, filed on Sep. 22, 2014.
*Inter Partes* Review Case No. IPR2014-01369, Exhibit 1008 to Corrected Petition for *Inter Partes* Review, "Declaration of Dr. Nader Bagherzadeh under 37 C.F.R. § 1.68," filed on Sep. 22, 2014.
*Inter Partes* Review Case No. IPR2014-01369, Exhibit 1013 to Corrected Petition for *Inter Partes* Review, "Webster's II New College Dictionary," filed on Sep. 22, 2014.
*Inter Partes* Review Case No. IPR2014-01369, Exhibit 1014 to Corrected Petition for *Inter Partes* Review, "Standard Dictionary of Electrical and Electronics Terms," IEEE 1988, filed on Sep. 22, 2014.
*Inter Partes* Review of U.S. Patent No. 7,881,150, IPR Case No. IPR2014-00882, Corrected Petition for *Inter Partes* Review of U.S. Patent No. 7,881,150, filed on Jul. 8, 2014.
*Inter Partes* Review of U.S. Patent No. 7,881,150, IPR Case No. IPR2014-00882, Exhibit 1007 to Petition for *Inter Partes* Review, "Declaration of Dr. Srinivasan Jagannathan," filed on Jun. 22, 2014.
*Inter Partes* Review of U.S. Patent No. 7,881,150, IPR Case No. IPR2014-00882, Patent Owner's Preliminary Response Pursuant to 37 C.F.R. § 42.107, filed Oct. 7, 2014.
*Inter Partes* Review of U.S. Patent No. 7,881,150, IPR Case No. IPR2014-00882, Decision—Institution of *Inter Partes* Review 37 C.F.R. § 42.108, issued Dec. 16, 2014.
*Inter Partes* Review of U.S. Patent No. 8,081,536, IPR Case No. IPR2014-00883, Corrected Petition for *Inter Partes* Review of U.S. Patent No. 8,081,536, filed on Jul. 8, 2014.
*Inter Partes* Review of U.S. Patent No. 8,081,536, IPR Case No. IPR2014-00883, Exhibit 1011 to Petition for *Inter Partes* Review, "Declaration of Dr. Srinivasan Jagannathan," filed on Jun. 21, 2014.

(56) References Cited

OTHER PUBLICATIONS

*Inter Partes* Review of U.S. Patent No. 8,081,536, IPR Case No. IPR2014-00883, Patent Owner's Preliminary Response Pursuant to 37 C.F.R. § 42.107, filed Oct. 7, 2014.
*Inter Partes* Review of U.S. Patent No. 8,081,536, IPR Case No. IPR2014-00883, Decision—Institution of *Inter Partes* Review 37 C.F.R. § 42.108, issued Dec. 16, 2014.
*Inter Partes* Review of U.S. Patent No. 7,881,150, IPR Case No. IPR2014-01011, Corrected Petition for *Inter Partes* Review ofU.S. Patent No. 7,881,150, filed on Jul. 8, 2014.
*Inter Partes* Review of U.S. Patent No. 7,881,150, IPR Case No. IPR2014-01011, Exhibit 1007 to Petition for *Inter Partes*Review, "Declaration of Dr. Srinivasan Jagannathan." filed on Jun. 22, 2014.
*Inter Partes* Review of U.S. Patent No. 7,881,150, IPR Case No. IPR2014-01011, Patent Owner's Preliminary Response Pursuant to 37 C.F.R. § 42.107, filed Oct. 7, 2014.
*Inter Partes* Review of U.S. Patent No. 7,881,150, IPR Case No. IPR2014-01011, Decision—Institution of *Inter Partes* Review 37 C.F.R. § 42.108, issued Dec. 16, 2014.
*Inter Partes* Review of U.S. Patent No. 7,881,150, IPR Case No. IPR2014-01011, Exhibit 3001 to Decision—Institution of *Inter Partes* Review, Excerpts from IEEE Dictionary, issued Dec. 16, 2014.
*Inter Partes* Review of U.S. Patent No. 7,881,150, IPR Case No. IPR2014-01011, Exhibit 3002 to Decision—Institution of *Inter Partes* Review, Excerpts from IEEE Dictionary, issued Dec. 16, 2014.
*Inter Partes* Review of U.S. Patent No. 7,881,150, IPR Case No. IPR2014-01011, Exhibit 3003 to Decision—Institution of *Inter Partes* Review, Excerpts from Oxford English Dictionary, issued Dec. 16, 2014.
*Inter Partes* Review of U.S. Patent No. 7,881,150, IPR Case No. IPR2014-01011, Exhibit 3004 to Decision—Institution of *Inter Partes* Review, Excerpts from Oxford English Dictionary, issued Dec. 16, 2014.
McCluskey, Edward J., *Logic Design Principles with Emphasis on Testable Semicustom Circuits*, Prentice Hall, 1986, pp. 104-107 and 119-120.
U.S. District Court Northern District of California, Case No. 4:13-CV-05889-YGR, *Netlist, Inc. v. Smart Storage Systems, Inc., and Diablo Technologies, Inc.*, Smart Storage Systems, Inc.'s Invalidity Contentions, dated Jun. 6, 2014.
U.S. District Court Northern District of California, Case No. 4:13-CV-05889-YGR, *Netlist, Inc. v. Smart Storage Systems, Inc., and Diablo Technologies, Inc.* Exhibits E.1-E.7 to "Smart Storage Systems, Inc.'s Invalidity Contentions," dated Jun. 6, 2014.
U.S. District Court Northern District of California, Case No. 4:13-CV-05889-YGR, *Netlist, Inc.v. Smart Storage Systems, Inc., and Diablo Technologies, Inc.* Exhibits F.1-F.5 to "Smart Storage Systems, Inc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.* Exhibits G.1-G.6 to "Smart Storage Systems, Inc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibit H to "Smart Storage Systems, Inc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Diablo Technologies, Inc.'s Invalidity Contentions, dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibits D-1 to D6 to "Diablo Technologies, Inc.'s Invalidity Contentions," dated Jun. 6, 2014.
U.S. District Court Northern District of California, Case No. 4:13-CV-05889-YGR, *Netlist, Inc.v. Smart Storage Systems, Inc., and Diablo Technologies, Inc.*, Exhibits F-1 to F-5 to "Diablo Technologies, Inc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibits G-1 to G-6 to "Diablo Technologies, Inc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibit H to "Diablo Technologies, Inc.'s Invalidity Contentions," dated Jun. 6, 2014.
Altera, ACEX iK, Programmable Logic Device Family, Data Sheet, May 2003, Ver 3.4.
Horowitz, "The Art of Electronics," Cambridge Univ. Press, 1989, selected pages.
Huang et al, "An Efficient Parallel Transparent BIST Method for Multiple Embedded Memory Buffers," VLSI Design 2011, p. 379.
Jacob, Bruce L.; "Synchronous DRAM Architectures, Organizations, and Alternative Technologies". University of Maryland, Dec. 10, 2002.
JEDEC Standard No. 21-C Section 4.5.7, 168 Pin Registered SDRAM DIMM Family, Release 7, Oct. 2001.
JEDEC 21-C, Section 4.6.1, 278 Pin Buffered SDRAM DIMM Family, Jun. 1997.
JEDEC Standard No. 21-C Section 4.1.2.5, Appendix E, "Specific PD's for Synchronous DRAM (SDRAM)," pp. 1-25, May 2003.
JEDEC Standard, "Fully Buffered DIMM (FBDIMM): DFx Design for Validation and Test," JESD82-28, Feb. 2008.
Anonymous. (Dec. 1996). "Applications Note: Understanding DRAM Operation," IBM, 10 pages.
Behrens, S. "HP Printer Memory Explained", The ZonkPage, Last Updated Jan. 21, 2004. Accessed Feb. 10, 2013, Retrieved from the Internet: URL <http://warshaft.com/hpmem.htm>. 7pp.
Non-final office action, U.S. Appl. No. 13/411,344, Jul. 7, 2014, 19 pages.
Non-Final Office Action, U.S. Appl. No. 13/412,243, Jan. 2, 2014, 20 pages.
Non-final office action, U.S. Appl. No. 13/288,850, Oct. 11, 2013, 24 pages.
Non-final office action, U.S. Appl. No. 13/411,344, Dec. 31, 2013, 28 pages.
Non-final office action, U.S. Appl. No. 13/473,413, Nov. 17, 2011, 46 pages.
Response to non-final office action dated Oct. 11, 2013 for U.S. Appl. No. 13/288,850, filed Jan. 13, 2014, 15 pages.
Response to non-final office action dated Dec. 31, 2013 for U.S. Appl. No. 13/411,344, filed Mar. 31, 2014, 12 pages.
Notice of Allowance, U.S. Appl. No. 12/504,131, Feb. 12, 2013, 52 pages.
Non-Final Office Action, dated Jan. 2, 2014, for U.S. Appl. No. 13/287,042, filed Nov. 1, 2011, 42 pages.
Response to Non-Final Office Action dated Jan. 2, 2014, filed Apr. 2, 2004, for U.S. Appl. No. 13/287,042, filed Nov. 1, 2011, 12 pages.
Office Action mailed Apr. 2, 2014, for Japanese Patent Application No. 2012-520662 and English translation thereof, 7 pages.
Miles J. Murdocca et al., "Principles of Computer Architecture", Prentice Hall, 2000, pp. 249-251.
Intel® 6400/6402 Advanced Memory Buffer Datasheet, published Oct. 2006.
Micron "Synchronous DRAM Module MT18LSDT472," 1998, Micron Technology, Inc., 17 pages.
PC133 SDRAM Registered DIMM Design Specification, Revision 1.1, Aug. 1999, 62 pages.
Micron DDR SDRAM DIMM Module 256MB, 512 MB, Mar. 2002, 26 pages.
Reese, "Introduction to Logic Synthesis using Verilog HDL," Morgan&Claypool Publishers, 2006, pp. 1-28.
64 & 72 Pin Zip/Simm Sram Module, JEDEC, Standard No. 21-C, www.jedec.com/download/search/4.sub.--04.sub.--01.pdf, Jun. 1997 pp. 4.4.1-1.
Distributed Memory Mapping, IP.com, IPCOM000014788D, 2000.
Intel Corporation, 66/100 MHz PC SDRAM 64-Bit Non-ECC/Parity 144 Pin Unbuffered SO-DIMM Specification, Revision 1.0, Feb. 1999.
Intel Corporation, PC SDRAM Registered DIMM Design Support Document, Revision 1.2, Oct. 1998.
JEDEC "JEDEC Standard: Double Data Rate (DDR) SDRAM Specification", JESD79C Mar. 2003.

(56) References Cited

OTHER PUBLICATIONS

JEDEC Standard No. 21-C, 4.20-2-168 Pin, PC133 SDRAM Registered Design Specification, Revision 1.4, Release 11a, Feb. 2002.
Jedec Standard No. 21-C, DDR SDRAM PC2100 and PC1600 DDR SDRAM Registered DIMM Design Specification, Revision 1.3, Release 11b, Jan. 2002.
Jedec Standard, "Definition of the SSTV16859 2.5 V 13-Bit to 26-Bit SSTL.sub.—2 Registered Buffer for Stacked DDR DIMM Applications," JESD82-4B, May 2003.
Jin et al. "Embedded Memory in System-On-Chip Design: Architecture and Prototype Implementation," CCECE, 2003, pp. 141-146.
Jin et al. "Prototype Implementation and Evaluation of a Multibank Embedded Memory Archtecture in Programmable Logic," IEEE, 2003, pp. 13-16.
Lee et al. "A banked-promotion translation lookaside buffer system," Journal of Systems Architecture, vol. 47, 2002, pp. 1065-1078.
Lee et al. "An on-chip cache compression technique to reduce decompression overhead and design complexity." Journal of Systems Architecture, vol. 46, 2000, pp. 1365-1382.
Micron "DDR SDRAM RDIMM, MT36VDDF12872-1GB, MT36VDDF25672-2GB," 2002 Micron Technology, Inc. 20 pages.
Sunaga et al. "Continuous RAS Access Method in Multiple-bank DRAM Chip," IP.com, IPCOM000123375D, 1998.
Takai et al. "250 Mbyte/s Synchronous DRAM Using a 3-Stage—Pipelined Architecture," IEEE Journal of Solid-State Circuits, vol. 29, No. 4, p. 426-431, dated Apr. 1994.
Toal et al. "A 32-Bit SoPC Implementation of a P5." Proceedings of the Eighth IEEE International Symposium on Computers and Communications, 2003, pp. 1530-1346.
Tudruj, Marek. "Dynamically reconfigurable heterogenous multi-processor systems with transputer-controlled communication," Journal of Systems Architecture, vol. 43, 1997, pp. 27-32.
JEDEC Standard JESD79D, "Double Data Rate (DDR) SDRAM Specification," published Jan. 2004 (Feb. 2004).
PC2100 and PC1600 DDR SDRAM Registered DIMM Design Specification JEDEC, Standard No. 21-C, Revision 1.3, Jan. 2002, pp. 4.20.4-1.

* cited by examiner

MEMORY MODULE WITH DISTRIBUTED DATA BUFFERS AND METHOD OF OPERATION

CLAIM OF PRIORITY

The present application claims priority to U.S. Provisional App. No. 61/676,883, filed on Jul. 27, 2012, which is incorporated by reference herein in its entirety.

CROSS REFERENCE TO RELATED APPLICATIONS

The present application is related to commonly-owned U.S. patent application Ser. No. 12/504,131, filed on Jul. 16, 2009, now U.S. Pat. No. 8,417,870, U.S. patent application Ser. No. 12/761,179, filed on Apr. 15, 2010, U.S. patent application Ser. No. 13/287,042, filed on Nov. 1, 2011, and U.S. patent application Ser. No. 13/287,081, filed on Nov. 1, 2011, each of which is incorporated herein by reference in its entirety.

FIELD

The disclosure herein is related generally to memory modules, and more particularly to multi-rank memory modules and methods of operation.

BACKGROUND

With recent advancement of information technology and widespread use of the Internet to store and process information, more and more demands are placed on the acquisition, processing, storage and dissemination of vocal, pictorial, textual and numerical information by microelectronics-based combination of computing and communication means. In a typical computer or server system, memory modules are used to store data or information. A memory module usually includes multiple memory devices, such as dynamic random access memory devices (DRAM) or synchronous dynamic random access memory devices (SDRAM), packaged individually or in groups, and/or mounted on a printed circuit board (PCB). A processor or a memory controller accesses the memory module via a memory bus, which, for a single-in-line memory module (SIMM), can have a 32-bit wide data path, or for a dual-in-line memory module (DIMM), can have a 64-bit wide data path.

The memory devices of a memory module are generally organized in ranks, with each rank of memory devices generally having a bit width. For example, a memory module in which each rank of the memory module is 64 bits wide is described as having an "×64" or "by 64" organization. Similarly, a memory module having 72-bit-wide ranks is described as having an "×72" or "by 72" organization.

The memory capacity or memory density of a memory module increases with the number of memory devices on the memory module. The number of memory devices of a memory module can be increased by increasing the number of memory devices per rank or by increasing the number of ranks.

In certain conventional memory modules, the ranks are selected or activated by control signals from a processor or memory controller during operation. Examples of such control signals include, but are not limited to, rank-select signals, also called chip-select signals. Most computer and server systems support a limited number of ranks per memory module, which limits the memory density of the memory modules that can be used in these computer and server systems.

For memory devices in such as a memory module to be properly accessed, distribution of control signals and a control clock signal in the memory module is subject to strict constraints. In some conventional memory modules, control wires are routed so there is an equal length to each memory component, in order to eliminate variation of the timing of the control signals and the control clock signal between different memory devices in the memory modules. The balancing of the length of the wires to each memory devices compromises system performance, limits the number of memory devices, and complicates their connections.

In some conventional memory systems, the memory controllers include leveling mechanisms for write and/or read operations to compensate for unbalanced wire lengths and memory device loading on the memory module. As memory operating speed and memory density continue to increase, however, such leveling mechanisms are also insufficient to insure proper timing of the control and/or data signals received and/or transmitted by the memory modules.

DESCRIPTION OF EMBODIMENTS

Figure 1:
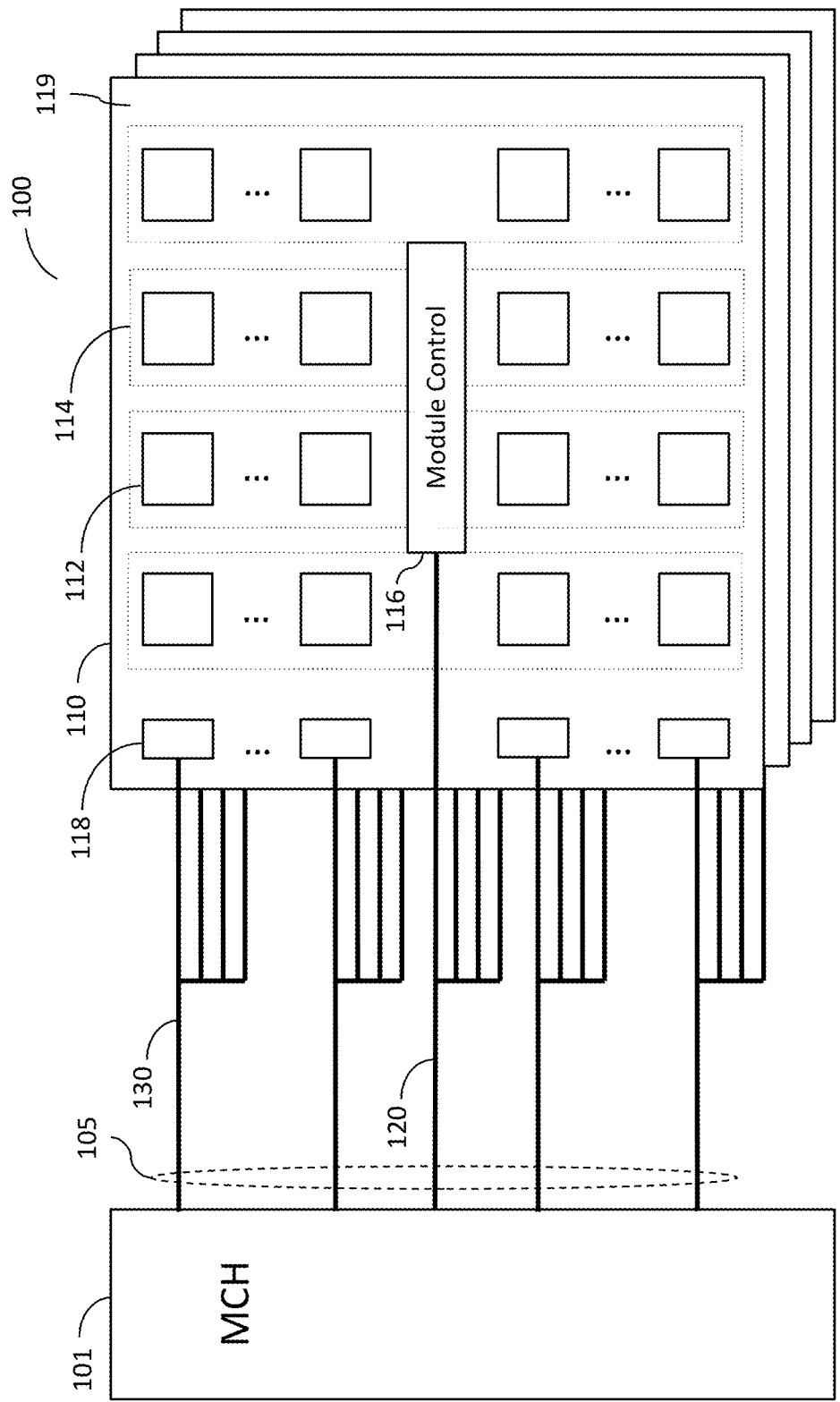
FIG. 1 is a diagram illustrating a memory system including at least one memory module according to one embodiment.

A memory module according to one embodiment includes memory devices organized in groups, a module control device, and data buffers (DB). The data buffers are sometimes referred to herein as buffer circuits, isolation devices (I.D.) or load reduction devices. The memory module is operable to perform memory operations in response to memory commands (e.g., read, write, refresh, precharge, etc.), each of which is represented by a set of control/address (C/A) signals transmitted by the memory controller to the memory module. The C/A signals may include, for example, a row address strobe signal (/RAS), a column address strobe signal (/CAS), a write enable signal (/WE), an output enable signal (/OE), one or more chip select signals, row/column address signals, and bank address signals. The memory controller may also transmit a system clock signal to the memory module. In one embodiment, the C/A signals and the system clock signal are received by the module control device, which generates a set of module command signals and a set of module control signals in response to each memory command from the memory controller. The module command signals are transmitted by the module control device to the memory devices via module C/A signal lines, and the module control signals (referred sometimes herein as module control signals) are transmitted by the module control device to the buffer circuits via module control signal lines.

The buffer circuits are associated with respective groups of memory devices and are distributed across the memory module at positions corresponding to the respective groups of memory devices. Thus, during certain high speed operations, each module control signal may arrive at different buffer circuits at different points of time across more than one clock cycle of the system clock. Also, each buffer circuit associated with a respective group of memory devices is in the data paths between the respective group of memory devices and the memory controller. Thus, the memory controller does not have direct control of the memory devices. In one embodiment, each group of memory devices include at least two subgroups, each subgroup including at least one memory device. Each buffer circuit is configured to select a subgroup in the respective group of memory devices to communicate data with the memory controller in response to the module control signals. Thus, the memory module can have more ranks of memory devices than what is supported by the memory controller.

In one embodiment, each buffer circuit includes metastability detection circuits to detect metastability condition in the module control signals and signal adjustment circuits to adjust the module control signals and/or a module clock signal to mitigate any metastability condition in the module control signals.

Further, in one embodiment, each buffer circuit includes signal alignment circuits that determine, during a write operation, a time interval between a time when one or more module control signals are received from the module control circuit and a time when a strobe or data signal is received from the memory controller. This time interval is used during a subsequent read operation to time transmission of read data to the memory controller, such that the read data arrives at the memory controller within a time limit in accordance with a read latency parameter associated with the memory system.

FIG. 1 shows a system 100 including a memory controller (MCH) 101 and one or more memory modules 110 coupled to the MCH by a memory bus 105, according to one embodiment. As shown, the memory bus includes C/A signal lines 120 and groups of system data/strobe signal lines 130. Also as shown, each memory module 110 has a plurality of memory devices 112 organized in a plurality of ranks 114. Each memory module 110 further includes a module control circuit (module controller or module control device) 116 coupled to the MCH 101 via the C/A signal lines 120, and a plurality of buffer circuits or isolation devices 118 coupled to the MCH 101 via respective groups of system data/strobe signal lines 130. In one embodiment, the memory devices 112, the module control circuit 116 and the isolation devices 118 can be mounted on a same side or different sides of a printed circuit board (module board) 119.

In the context of the present description, a rank refers to a set of memory devices that are selectable by a same chip select signal from the memory controller. The number of ranks of memory devices in a memory module 110 may vary. For example, as shown, each memory module 110 may include four ranks of memory devices 112. In another embodiment, the memory module 110 may include 2 ranks of memory devices. In yet another embodiment, the memory module may include six or more ranks of memory devices 112.

In the context of the present description, a memory controller refers to any device capable of sending instructions or commands, or otherwise controlling the memory devices 112. Additionally, in the context of the present description, a memory bus refers to any component, connection, or groups of components and/or connections, used to provide electrical communication between a memory module and a memory controller. For example, in various embodiments, the memory bus 105 may include printed circuit board (PCB) transmission lines, module connectors, component packages, sockets, and/or any other components or connections that provide connections for signal transmission.

Furthermore, the memory devices 112 may include any type of memory devices. For example, in one embodiment, the memory devices 112 may include dynamic random access memory (DRAM) devices. Additionally, in one embodiment, each memory module 110 may include a dual in-line memory module (DIMM).

Figure 2A:
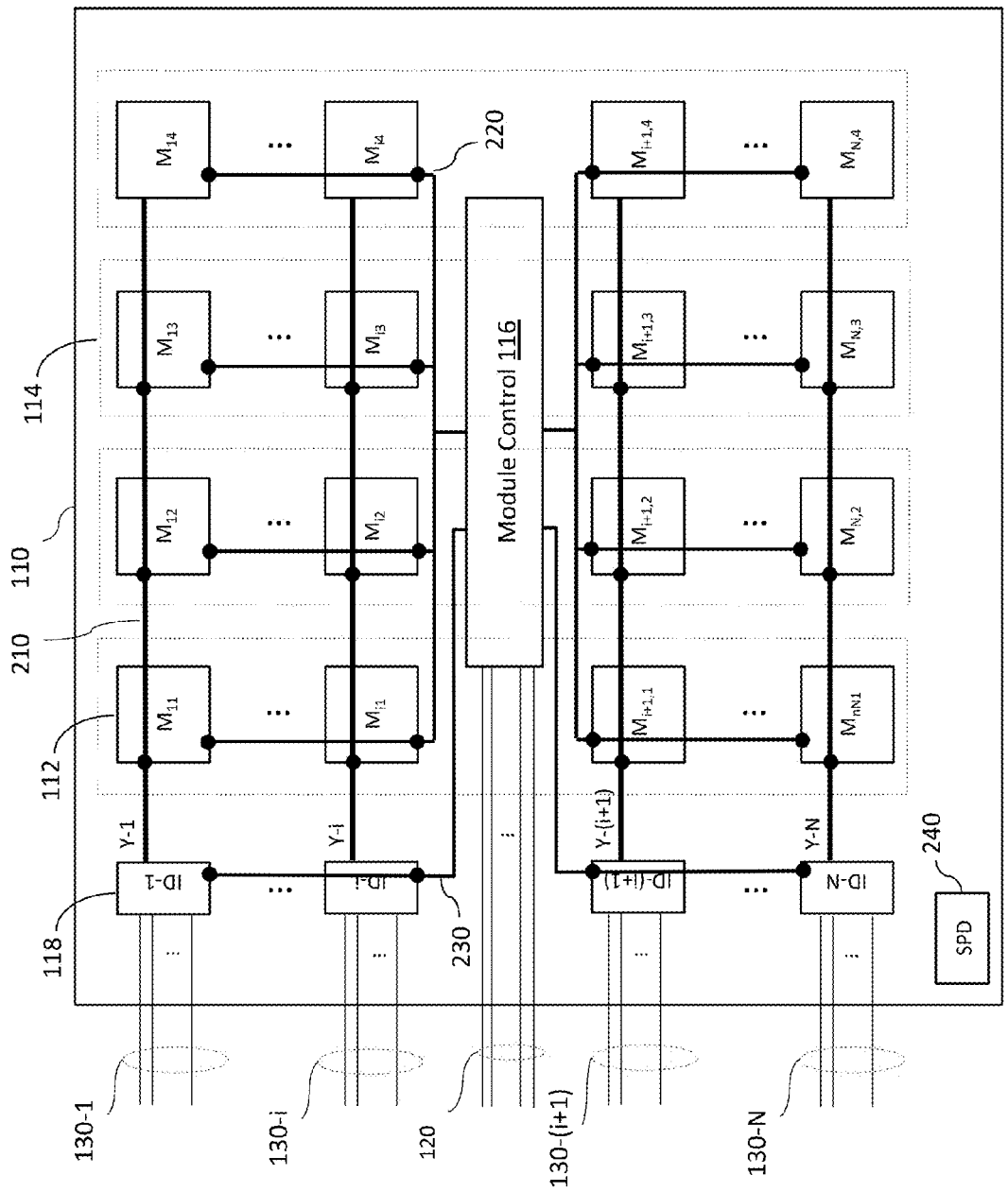
FIGS. 2A-2D are each a diagrams illustrating interactions among components in a a memory module according to certain embodiments.

Referring to FIG. 2A, which illustrates one memory module 110 according to an embodiment, the module control device 116 receives system memory commands represented by a set of system control/address (C/A) signals from the MCH 101 via signal lines 120 and generates module command signals and module control signals based on memory commands from the system. The module control device 116 also received a system clock MCK and generates a module clock signal CK in response to the system clock signal MCK. The MCK signal may include a pair of complementary clock signals, MCK and $\overline{MCK}$, and the module clock signal may include a pair of complementary clock signals CK and $\overline{CK}$.

Examples of the system C/A signals include, but are not limited to, Chip Select (or /CS) signal, which is used to select a rank of memory devices to be accessed during a memory (read or write) operation; Row Address Strobe (or /RAS) signal, which is used mostly to latch a row address and to initiate a memory cycle; Column Address Strove (or /CAS) signal, which is used mostly to latch a column address and to initiate a read or write operation; address signals, including bank address signals and row/column address signals, which are used to select a memory location on a memory device or chip; Write Enable (or /WE) signal, which is used to specify a read operation or a write operation, Output Enable (or /OE) signal, which is used to prevent data from appearing at the output until needed during a read operation, and the system clock signal MCK.

Examples of module command signals include, but are not limited to module /CS signals, which can be derived from the system /CS signals and one or more other system C/A signals, such as one or more bank address signals and/or one or more row/column address signals; a module /RAS signal, which can be, for example, a registered version of the system /RAS signal; a module /CAS signal, which can be, for example, a registered version of the system /CAS signal; module address signals, which can be, for example, registered versions of some or all of the address signals; a module /WE signal, which can be, for example, a registered version of the system /WE signal; a module /OE signal, which can be, for example a registered version of the system /OE signal. In certain embodiments, the module command signals may also include the module clock signal CK.

Examples of module control signals include, but are not limited to a mode signal (MODE), which specifies a mode of operation (e.g., test mode or operating mode) for the isolation devices 118; one or more enable signals, which are used by an isolation device to select one or more subgroups of memory devices to communicate data with the memory controller; and one or more ODT signals, which are used by the isolation devices to set up on-die termination for the data/strobe signals. In one embodiment, the module control signals are transmitted to the isolation devices 118 via respective module control signal lines 230. Alternatively, the module control signals can be packetized before being transmitted to the isolation devices 118 via the module control signal lines and decoded/processed at the isolation devices.

Module control device 116 transmits the module command signals to the memory devices 112 via module C/A signal lines 220. The memory devices 112 operate in response to the module command signals to receive write data or output read data as if the module command signals were from a memory controller. The module control device transmits the module control signals together with the module clock signal CK to the isolation devices 118 via module control signal lines 230. As shown in FIG. 2, at least some of the memory devices in a same rank share a same set of module C/A signal lines 220, and at least some of the isolation devices 118 share a same set of module control signal lines 230.

Figure 2B:
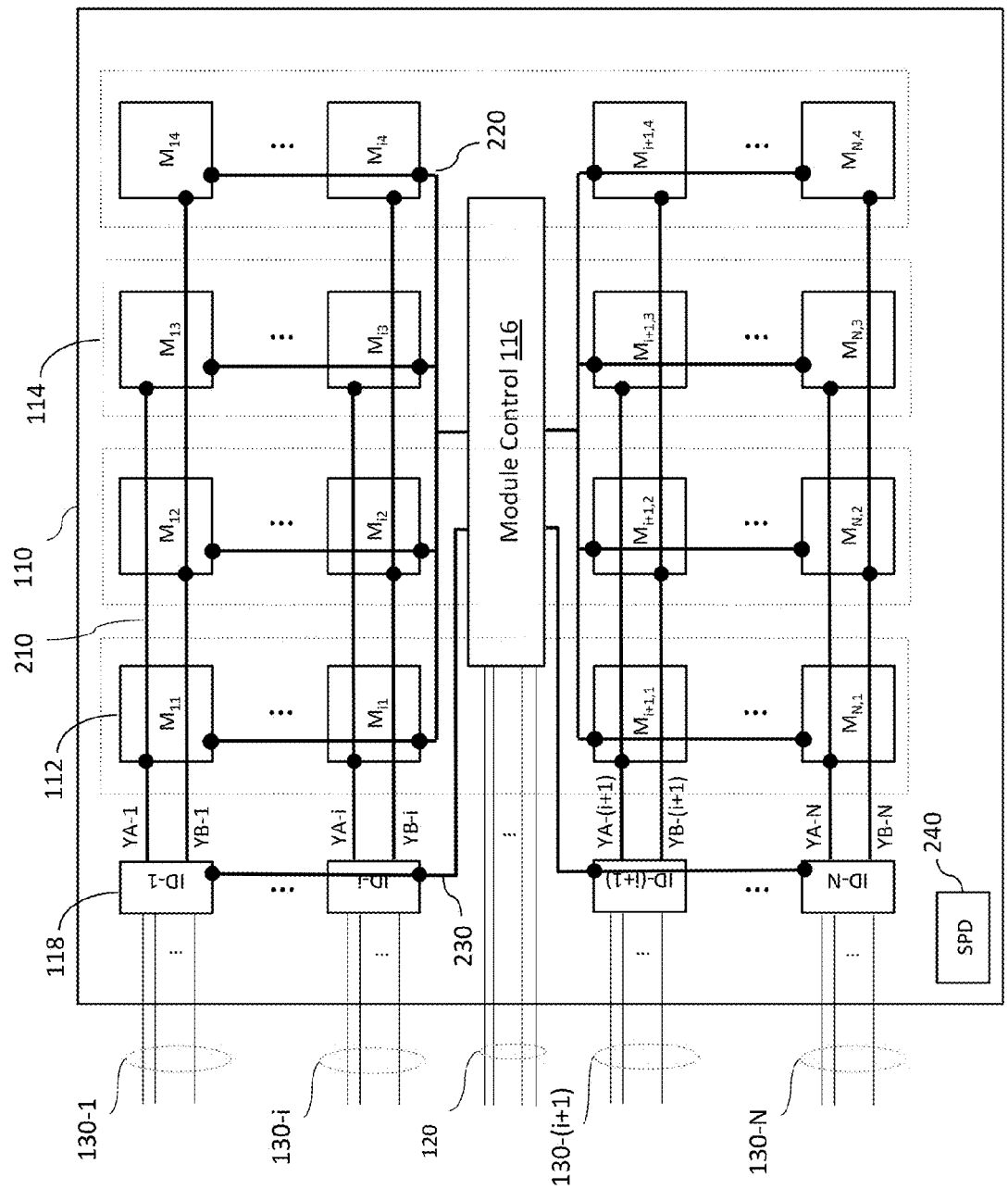

As shown n FIGS. 2A and 2B, each rank 114 includes N memory devices, where N is an integer larger than one. For example, a first rank includes memory devices $M_{11}, \ldots, M_{i1}$, $M_{i+1,1}, \ldots, M_N$, a second rank includes memory devices $M_{12}, \ldots, M_{i2}, M_{i+1,2}, \ldots, M_{N,2}$, and so on. In one embodiment, the memory devices 112 are also organized in groups or sets, with each group corresponding to a respective group of system data/strobe signal lines 130 and including at least one memory device from each rank. For example, memory devices $M_{11}, M_{12}, M_{13}$, and $M_{14}$ form a first group of memory devices, memory devices $M_{i1}, M_{i2}, M_{i3}$, and $M_{i4}$ form an $i^{th}$ group of memory devices, and so on.

As shown, the isolation devices 118 are associated with respective groups of memory devices and are coupled between respective groups of system data/strobe signal lines 130 and the respective groups of memory devices. For example, isolation device ID-1 among the isolation devices 118 is associated with the first group of memory devices $M_{11}$, $M_{12}, M_{13}$, and $M_{14}$ and is coupled between the group of system data/strobe signal lines 130-1 and the first group of memory devices, isolation devices ID-i among the isolation devices 118 is associated with the $i^{th}$ group of memory devices $M_{i1}, M_{i2}, M_{i3}$, and $M_{i4}$ and is coupled between the group of system data/strobe signal lines 130-$i$ and the $i^{th}$ group of memory devices, and so on.

In one embodiment, each group or sets of memory devices are coupled to the associated isolation device 118 via a set of module data/strobe lines 210. Each group or set of memory devices is organized in subgroups or subsets, with each subgroup or subset including at least one memory device. The subgroups in a group of memory devices may be coupled to the associated isolation device 118 via a same set of module data/strobe lines 210 (as shown in FIG. 2A) or via respective subsets of module data/strobe lines 210 (as shown in FIG. 2B). For example, as shown in FIG. 2B, in the first group of memory devices, memory devices $M_{11}$ and/or $M_{13}$ form a first subgroup, and memory devices $M_{12}$ and/or $M_{14}$ form a second subgroup; in the $i^{th}$ group of memory devices, memory devices $M_{i1}$ and/or $M_{i3}$ form a first subgroup, and memory devices $M_{i2}$ and/or $M_{i4}$ form a second subgroup; and so on. The first subgroup of at least one memory device in each group of memory devices is coupled to the associated isolation device 118 via an associated first subset of module data/strobe lines YA, and the second subgroup of at least one memory device in each group of memory devices is coupled to the associated isolation device via an associated second subset of module data/strobe lines YB, as shown. For example, memory devices $M_{11}$ and/or $M_{13}$ form the first subgroup are/is coupled to the isolation device ID-1 via the corresponding first subset of module data/strobe lines YA-1, and memory devices $M_{12}$ and/or $M_{14}$ form the second subgroup are/is coupled to the isolation device ID-1 via the corresponding second subset of module data/strobe lines YA-2.

In one embodiment, the isolation devices 118 are in the data paths between the MCH 101 and the memory module 110 and include data buffers between the MCH 101 and the respective groups of memory devices. In one embodiment, each isolation device 118 is configured to select a subgroup in the respective group of memory devices to communicate data with the MCH 101 in response to the module control signals, such that the memory module can include more ranks than what is supported by the MCH 101. Further, each isolation devices 118 is configured to isolate unselected subgroup(s) of memory devices from the MCH 101 during write operations, so that the MCH sees a load on each data line that is less than a load associated with the respective group of memory devices. In one embodiment, the MCH sees only a load associated with one memory device on each data/strobe signal line during write operations.

In one embodiment, the isolation devices 118 are distributed across the memory module 110 or the module board 119 in positions corresponding to the respective groups of memory devices. For example, isolation device ID-1 is disposed in a first position corresponding to the first group of memory devices $M_{11}, M_{12}, M_{13}$, and $M_{14}$, and isolation device ID-i is disposed in an $i^{th}$ position separate from the first position and corresponding to the $i^{th}$ group of memory devices $M_{i1}, M_{i2}, M_{i3}$, and $M_{i4}$. In one embodiment, the first position is between the first group of memory devices and an edge 201 of the module board 119 where connections (not shown) to the data/strobe signal lines 130 are placed, and $i^{th}$ position is between the $i^{th}$ group of memory devices and the edge 201 of the module board 119. In one embodiment, the isolation devices 118 are distributed along the edge 201 of the memory module 110. In one embodiment, each isolation device 118 is a separate integrated circuit device packaged either by itself or together with at least some of the respective group of memory devices. In one embodiment, the module data/strobe signal lines 210, the module C/A signal lines 220, and the module control signal lines 230 include signal traces formed on and/or in the module board 119.

As an option, memory module 110 may further include a serial-presence detect (SPD) device 240, which may include electrically erasable programmable read-only memory (EEPROM) for storing data that characterize various attributes of the memory module 110. Examples of such data include a number of row addresses, a number of column addresses, a data width of the memory devices, a number of ranks on the memory module 110, a memory density per rank, a number of memory device on the memory module 110, and a memory density per memory device, etc. A basic input/output system (BIOS) of system 100 can be informed of these attributes of the memory module 110 by reading from the SPD 240 and can use such data to configure the MCH 101 properly for maximum reliability and performance.

In certain embodiments, the SPD 240 and/or the control circuit 116 store module configuration information, such as: memory space translation code, memory address mapping function code, input and output signals timing control information for the control circuit 116, input and output signals electrical and logical level control information for the control circuit 116, etc. In certain embodiments, the SPD 240 contains a system view of the module 110 which can be different from an actual physical construction of the module 110. For example, the SPD 240 stores at least one memory operation parameter that is different from a corresponding memory operation parameter in a system memory controller setting. The SPD 240 may also store at least on data buffer operation parameter that is different from a corresponding parameter in the system memory controller setting.

Thus, in certain embodiment, in the memory module 110, C/A signals representing a memory command are received and buffered by the module control circuit 116, so that the MCH sees only the module control circuit 116 as far as the C/A signals are concerned. Write data and strobe signals from the controller are received and buffered by the isolation devices 118 before being transmitted to the memory devices 112 by the isolation devices 118. On the other hand, read data and strobe signals from the memory devices are received and buffered by the isolation devices before being transmitted to the MCH via the system data/strobe signal lines 130. Thus, MCH 101 does not directly operate or control the memory devices 112. As far as data/strobe signals are concerned, the MCH 101 mainly sees the isolation devices 118, and the system 100 depends on the isolation devices 118 to properly time the transmission of the read data and strobe signals to the MCH 101.

In certain embodiments, the memory module 110 is a dual in-line memory module (DIMM) and the memory devices are double data rate (DDR) dynamic random access memory devices (DRAM). In certain embodiments, the control circuit 116 includes a DDR register, and logic for memory space translation between a system memory domain and a module level physical memory domain. Such translation may produce address mapping, proper interface timing for the control signals to the module level physical memory domain, and a proper interface electrical and logical level for the control signals to the module level physical memory domain.

Figure 2C:
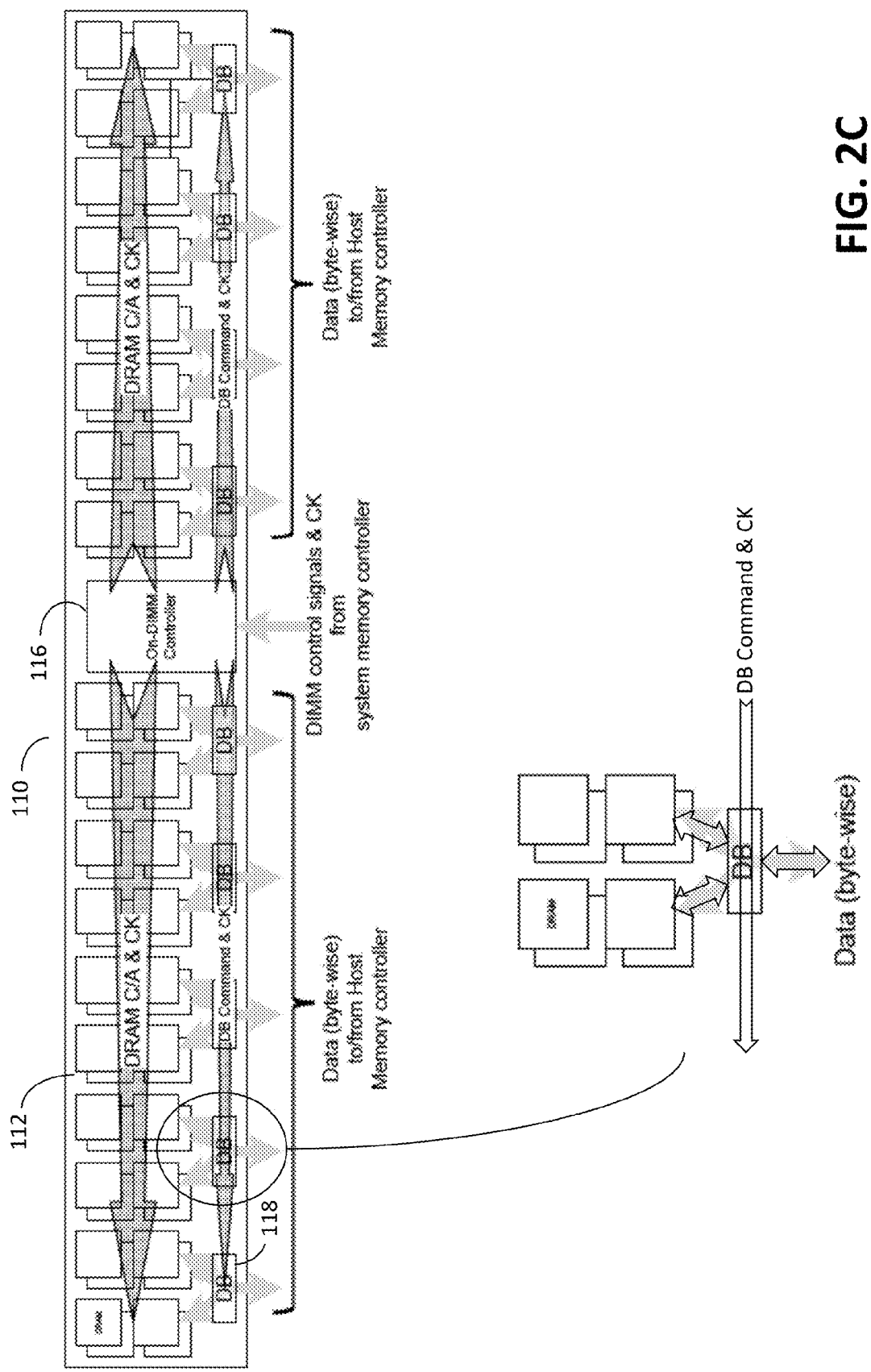

As shown in FIG. 2C, in certain embodiments, the control circuit 116 transmits registered C/A and clock signals to the memory devices 112, and transmits module control signals and a registered clock signal (or module clock signal) to the isolation devices 118, in a fly-by configuration. As the speed of memory operations increase, issues can arise with respect to signal alignment for input, output delay variation due process, voltage and temperature (PVT) variations, synchronization with system memory controller interface, and phase drift accumulation during operation, etc. Electrical interface calibration drift during operation due to charge build up and timing interface calibration drift during operation due to environment change can also create issues.

For example, load reduction mechanism in the isolation devices 118 would provide a single data bus interface to the respective set of memory devices, which is hidden from the system memory controller 101. Thus, a long sequence of interface timing training may be required due to limited controllability of the system memory controller 101 over the interface between the memory devices 112 and the associated isolation devices 118. Furthermore, interface signal alignment-drift after the initial training would not be easily detected by the system memory controller 101, which may cause silent system failure.

Moreover, clock skew amongst the memory devices 112 and the associated isolation devices 118 due to the distributed architecture of the memory module 110 can cause synchronization issues. As the speed of memory operation increase, data period can become very close to the signal propagation delay time. Thus, such issues cannot simply be addressed by pipelining the data paths, as variation of the signal propagation time through I/Os becomes a very significant portion of a data period.

Figure 2D:
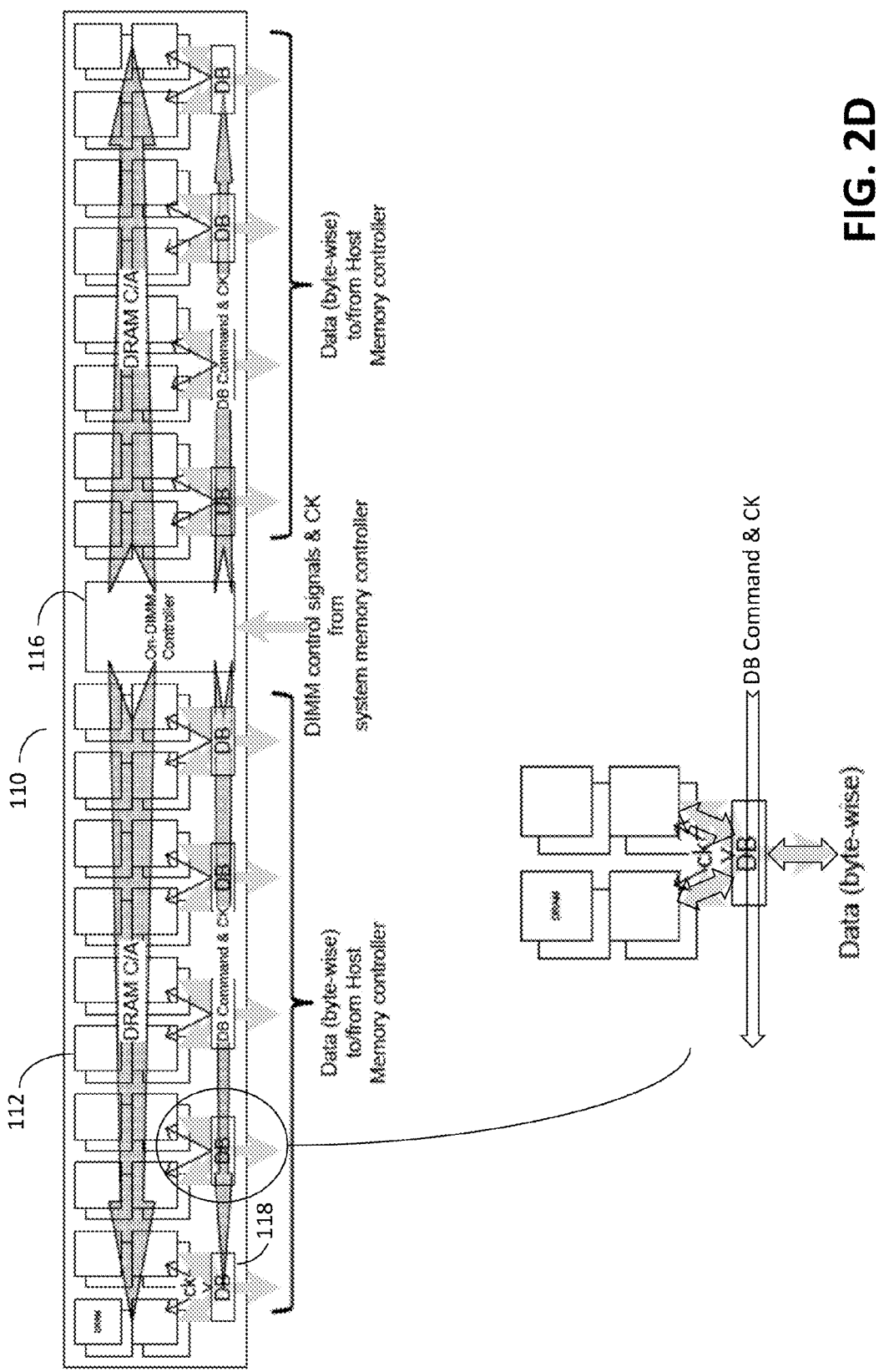

To address at least some of the above issues, in certain embodiments, as shown in FIG. 2D, the control circuit 116 transmits registered C/A signals to the memory devices 112, and transmits the module control signals and the module clock signal to the data buffers 118, in a fly-by arrangement. The memory devices 112 do not receive the module clock signal from the control circuit 116. Instead, each data buffer 118 regenerates the clock that is used by the respective set of memory devices 112. Each Data buffer 118 is thus responsible for providing a correct data timing interface between the respective set of memory devices 112 and the system memory controller 101. Each data buffer 118 is also responsible for providing the correct control signal timing between the control circuit 116 and the respective set of memory devices 112.

Thus, the memory module 110 in FIG. 2D allows a locally synchronized operation for each respective set of memory devices 112, which can correspond to a nibble or a byte of a DDR data bus between the memory module 110 and the system memory controller 101. Also, signal interface between each data buffer 118 and the respective set of memory devices 112 can be synchronized. In one embodiment, each data buffer 118 has a set of configurable operations, including, for example: programmable phase relationship between the clock it receives and the clock it regenerates, programmable phase adjustment for the data and data-strobe signals coupled to the memory devices 112, programmable phase adjustment for the data and data-strobe signals coupled to the system memory controller 101, programmable phase adjustment related to at least one control signal that is coupled to the control circuit 116. The locally synchronized operation also makes it easier for each data buffer 118 to perform self-testing of the associated set of memory devices 112, independent of the self-testing of other sets of memory devices performed by the other data buffers, as disclosed in commonly-owned U.S. Pat. No. 8,001,434, entitled "Memory Board with Self-Testing Capability," which is incorporated herein by reference in its entirety.

In certain embodiments, operations of the isolation devices 118 are controlled by the module control signals from the module control circuit 116, which generates the module control signals according to the C/A signals received from the MCH. Thus, the module control signals need to be properly received by the isolation devices 118 to insure their proper operation. In one embodiment, the module control signals are transmitted together with the module clock signal CK, which is also generated by the module control circuit 116 based on the system clock signal MCK. The isolation circuits 118 buffers the module clock signal, which is used to time the sampling of the module control signals. Since the isolation devices 118 are distributed across the memory module, the module control signal lines 230 can stretch across the memory module 110, over a distance of several centimeters. As the module control signals travel over such a distance, they can become misaligned with the module clock signal, resulting in metastability in the received module control signals. Therefore, in one embodiment, the isolation circuits 118 includes metastability detection circuits to detect metastability condition in the module control signals and signal adjustment circuits to adjust the module control signals and/or the module clock signal to mitigate any metastability condition in the module control signals, as explained in further detail below.

Because the isolation devices 118 are distributed across the memory module 110, during high speed operations, it may take more than one clock cycle time of the system clock MCK for the module control signals to travel along the module control signals lines 230 from the module control device 116 to the farthest positioned isolation devices 118, such as isolation device ID-1 and isolation device ID-(n−1) in the exemplary configuration shown in FIG. 2. In other words, a same set of module control signals may reach different isolation devices 118 at different times across more than one clock cycle of the system clock. For example, when the clock frequency of the system clock is higher than 800 MHz, the clock cycle time is less than about 1.2 ns. With a signal travel speed of about 70 ps per centimeter of signal line, a module control signal would travel about 15 cm during one clock cycle. When the clock frequency increases to 1600 MHz, a module control signal would travel less than 8 cm during one clock cycle. Thus, a module control signal line can have multiple module control signals on the line at the same time, i.e., before one module control signal reaches an end of the signal line, another module control signal appear on the signal line.

With the isolation devices 118 receiving module control signals at different times across more than one clock cycle, the module control signals alone are not sufficient to time the transmission of read data signals to the MCH 101 from the isolation devices 118. In one embodiment, each isolation devices includes signal alignment circuits that determine, during a write operation, a time interval between a time when one or more module control signals are received from the module control circuit 116 and a time when a write strobe or write data signal is received from the MCH 101. This time interval is used during a subsequent read operation to time the transmission of read data to the MCH 101, such that the read data follows a read command by a read latency value associated with the system 100, as explained in more detail below.

More illustrative information will now be set forth regarding various optional configurations, architectures, and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 3:
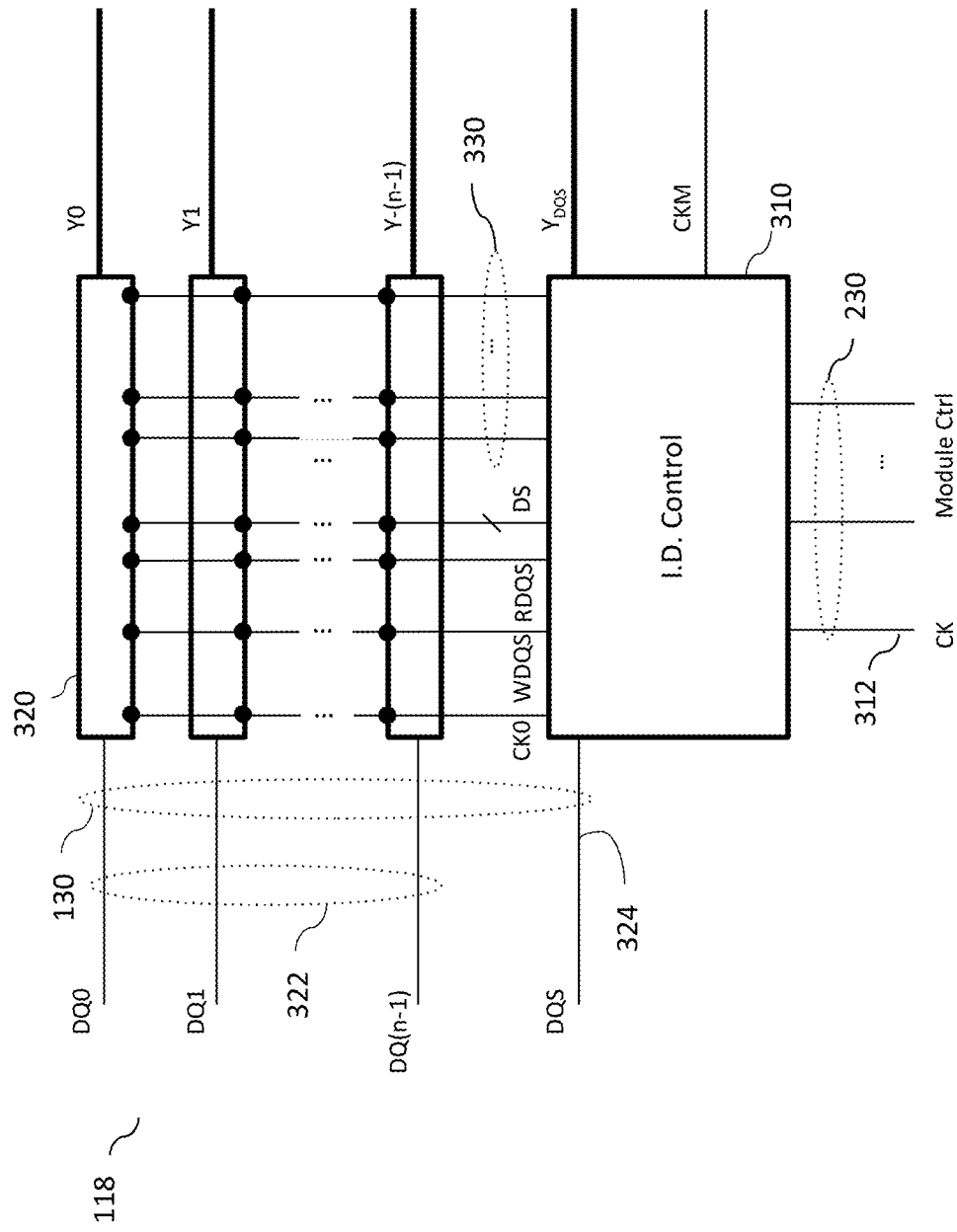
FIG. 3 is a diagram illustrating one of a plurality of data buffers in a memory module according to one embodiment.

In one embodiment, as shown in FIG. 3, each group of signal lines 130 include a set of n data (DQ) signal lines 322 each for transmitting one of a set of data signals $DQ_0$, $DQ_1, \ldots, DQ_{n-1}$, and at least one strobe (DQS) signal line 324 for transmitting at least one strobe signal DQS. Each set of module data/strobe lines Y include a set of n module data signal lines $Y_0, Y_1, \ldots, Y_{n-1}$ and at least one module strobe signal line $Y_{DQS}$. When the subsets of memory devices are coupled to the associated isolation device 118 via respective subsets of memory devices, each set of module data/strobe lines Y may include multiple subsets of module data/strobe lines, such as the subsets of module data/strobe lines YA and YB shown in FIG. 2B. Each subset of module data/strobe lines YA include a set of n first module data lines $YA_0$, $YA_1, \ldots, YA_n$ and at least one first module strobe signal line $YA_{DQS}$; and each subset of module data/strobe lines YB include a set of n second module data lines $YB_0, YB_1, \ldots, YB_n$ and at least one second module strobe signal line $YB_{DQS}$.

Each isolation device 118 includes a set of DQ routing circuits 320 coupled on one side to respective ones of the set of n DQ signal lines 322, and on another side to respective ones of the respective set of n module data lines, or respective ones of the respective subsets of module data lines, such as the first module data lines $YA_0, YA_1, \ldots, YA_n$ and the second module data lines $YB_0, YB_1, \ldots, YB_n$. Each isolation device 118 further includes an ID control circuit 310 coupled on one side to the at least one DQS signal line 324, on another side to the one or more module strobe signal lines $Y_{DQS}$, or the first module strobe signal line $YA_{DQS}$ and second module strobe signal line $YB_{DQS}$. The ID control circuit 310 also receives the module clock signal CK and the module control signals via the module control signal lines 230, and outputs ID control signals 330 to the DQ routing circuits 320, including, for example, one or more enable signals ENA and/or ENB, and some or all of the other received, decoded, and/or otherwise processed module control signals, a delay signal DS, a read DQS signal RDQS, a write DQS signal WDQS, and a buffer clock signal CK0. Each DQ routing circuit 320 is configured to enable data communication between the respective DQ signal line 322 with a selected subgroup of one or more memory devices in response to the module control signals, as explained in more detail below.

In certain embodiments, the ID control circuit 310 also provides a delay signal DS, which is used by the DQ routing circuits 320 to align read data output by the isolation device 118 with read data output by the other isolation devices 118, as explained in further detail below. In certain embodiments, the ID control circuit 310 regenerates a clock signal from the module clock signal CK, which can have a programmable delay from the module clock signal. The regenerated clock signal is used as the clock signal CK0 and a clock signal CKM that is provided to the corresponding set of memory devices, as explained in more detail below.

Figure 4A:
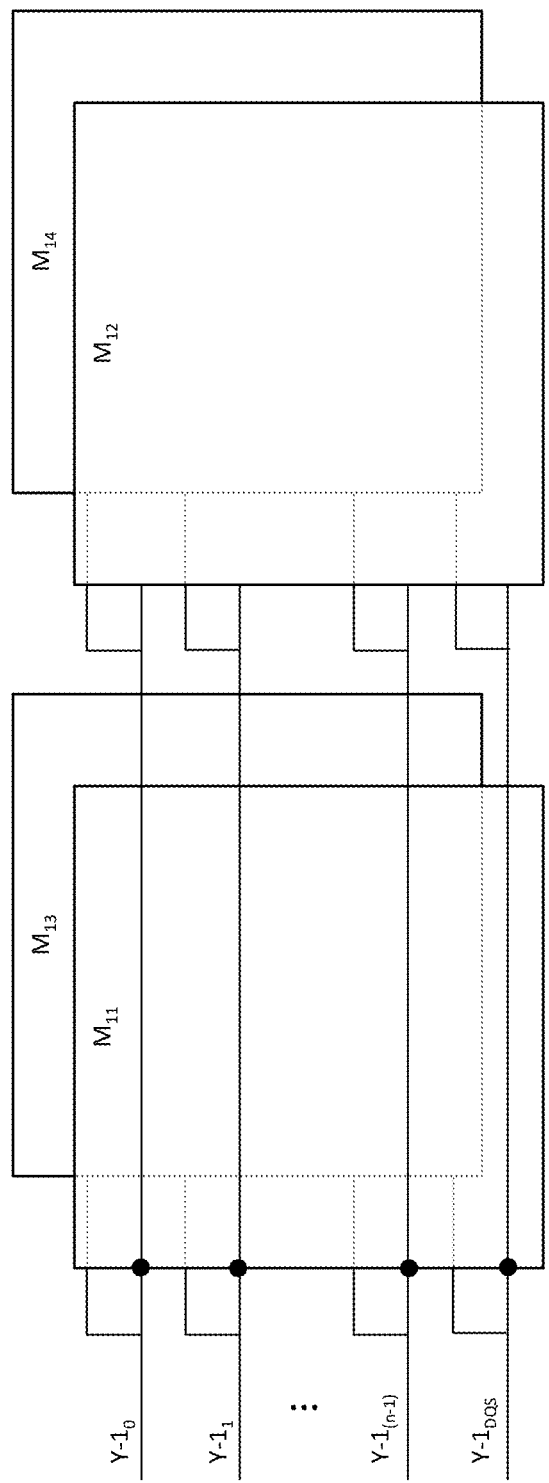
FIGS. 4A-4B are each a diagram illustrating data and data strobe signal lines coupled to memory devices in a memory module according to certain embodiments.

The memory devices 112 are coupled to the isolation devices 118 via a same set of module data/strobe signal lines or different subsets of module data/strobe signal lines. For example, as shown in FIG. 4A, memory devices $M_{11}$, $M_{12}$, $M_{13}$, and $M_{14}$ in the first group of memory devices can be coupled to the isolation device ID-1 via a same set of module data lines Y-$1_0$, Y-$1_1$, ..., Y-$1_{n-1}$ and module strobe line Y-$1_{DQS}$. In such embodiment, a subgroup in the group of memory devices can be selected by the isolation devices to communicated data with the MCH based on the phases of the data/strobe signals, which can be different with respect to different subgroups of memory devices.

Figure 4B:
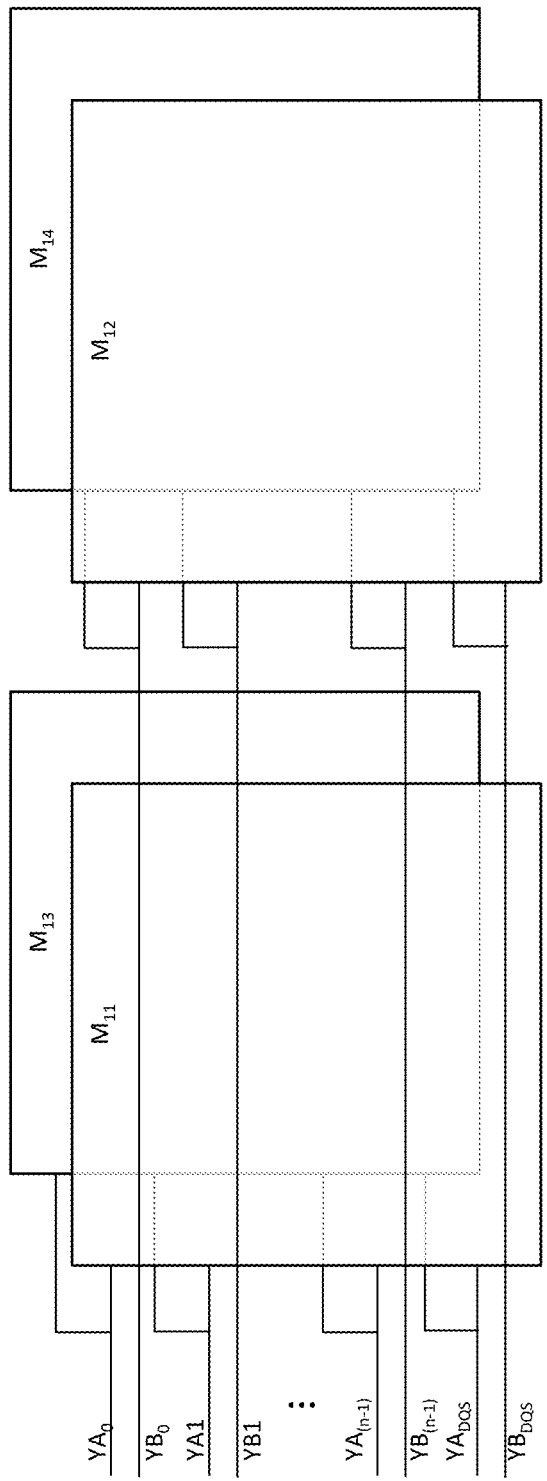

Alternatively, as shown in FIG. 4B, memory devices $M_{11}$ and $M_{13}$, which form a subgroup in the first group of memory devices, are coupled to the isolation device ID-1 via the module data lines YA-$1_0$, YA-$1_1$, ..., YA-$1_n$ and module strobe line YA-1$_{DQS}$ and memory devices M$_{12}$ and M$_{14}$, which form another subgroup in the first group of memory devices, are coupled to the isolation device ID-1 via the module data lines YB-1$_0$, YB-1$_1$, ..., YB-1$_n$ and module strobe line YB-1$_{DQS}$. Memory devices coupled to the same isolation devices can be disposed on a same side or different sides of the memory board 119. Memory devices coupled to the same isolation devices may be placed side by side, on opposite sides of the module boards 119, or stacked over each other, and/or over the associated isolation device.

Multiple memory devices having a data width that is less than a data width of the isolation devices 118 may be used in place of one of the memory devices 112, which has the same data width as that of the isolation devices. For example, as shown in FIG. 5A, two memory devices M$_{11-1}$ and M$_{11-2}$ may be used in place of the memory device M$_{11}$. Each of the two memory devices M$_{11-1}$ and M$_{11-2}$ has a data width of 4, and together they act like a memory device M$_{11}$ of a data width of 8. Thus, memory device M$_{11-1}$ is coupled to the isolation device ID-1 via module data lines YA-1$_0$, ..., YA-1$_3$ and module strobe line YA-1$_{DQS-1}$ while memory circuit M$_{11-2}$ is coupled to the isolation device ID-1 via module data lines YA-1$_4$, ..., YA-1$_7$ and module strobe line YA-1$_{DQS-2}$.

Figure 5B:
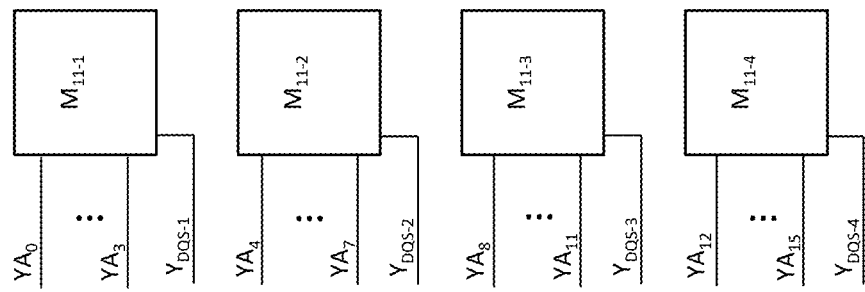
FIGS. 5A-5B are diagrams illustrating different numbers of memory devices that can be coupled to each data buffer in a memory module according to certain embodiments.
Figure 5A:
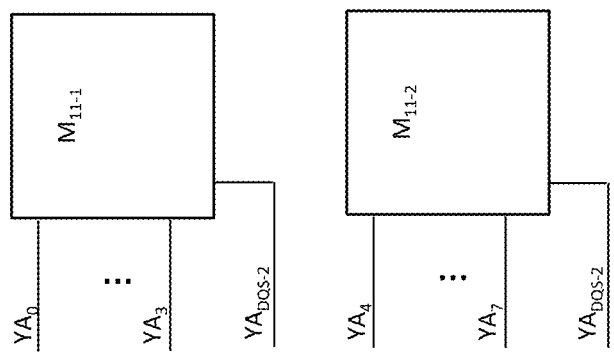

In another embodiment, as shown in FIG. 5B, four memory devices M$_{11-1}$ to M$_{11-4}$ may be used as the memory device M$_{11}$. Each of the four memory devices M$_{11-1}$ to M$_{11-4}$ has a data width of 4, and together they act like a memory device M$_{11}$ of a data width of 16. Thus, memory device M$_{11-1}$ is coupled to the isolation device ID-1 via module data lines YA-1$_0$, ..., YA-1$_3$ and module strobe line YA-1$_{DQS-1}$ while memory device M$_{11-2}$ is coupled to the isolation device ID-1 via module data lines YA-1$_4$, ..., YA-1$_7$ and module strobe line YA-1$_{DQS-2}$, and so on.

Figure 6:
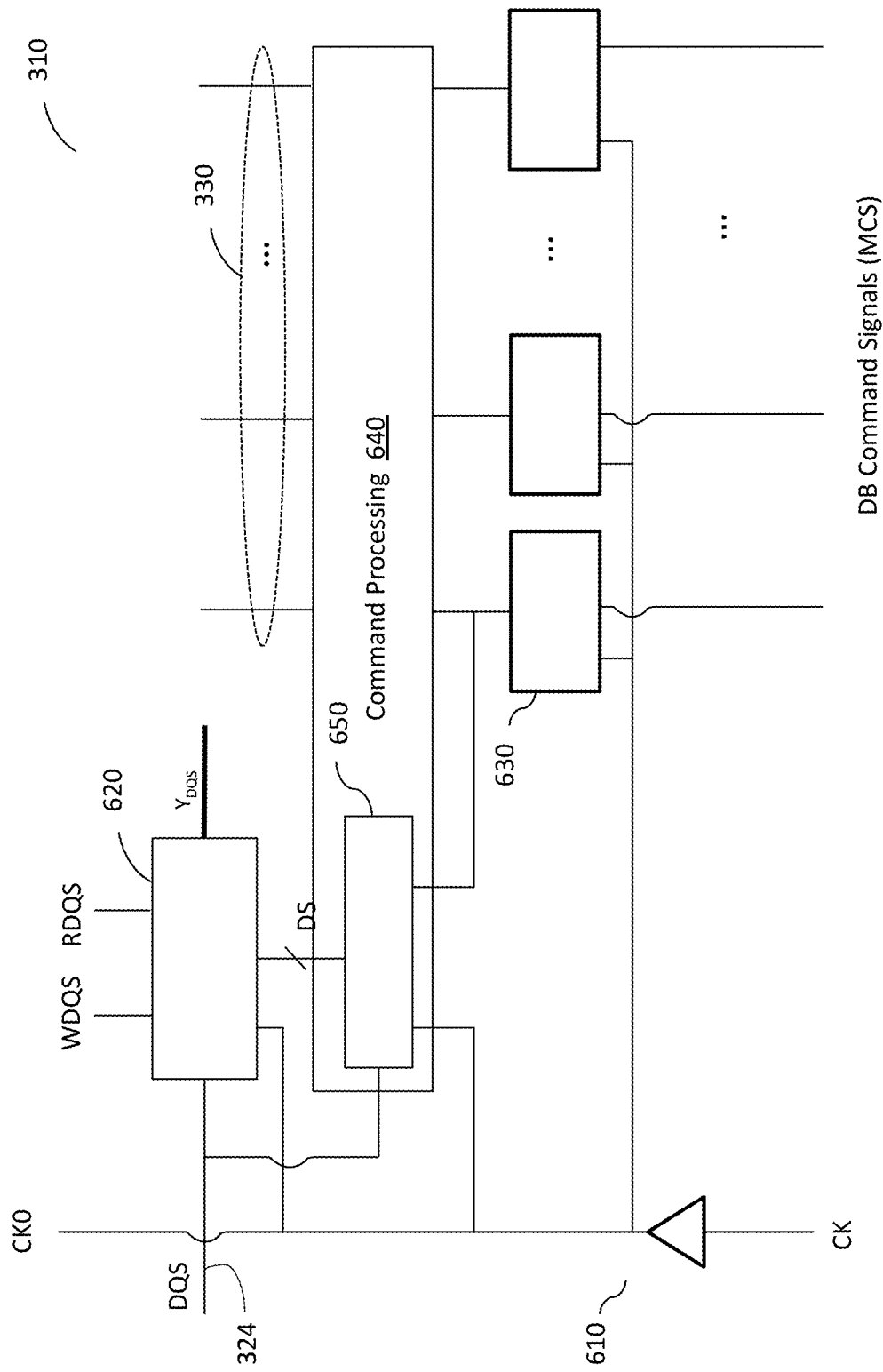
FIG. 6 is a diagram illustrating a control circuit in a data buffer according to certain embodiments.

FIG. 6 illustrates the ID control circuit 310 in an isolation device 118. As shown, the ID control circuit 310 includes a clock buffer 610 to receive the module clock signal CK from the module control device 116, and to output a module clock signal CK0. The ID control circuit 310 further includes a strobe routing circuit 620 that are coupled on one side to the corresponding system DQS signal line 324 and on another side to the corresponding module DQS signal lines YA$_{DQS}$ and YB$_{DQS}$. The ID control circuit 310 further includes a receiver circuit 630 with respect to each of at least some of the module control signals (MCS) to receive a respective one of the module control signals. The ID control circuit 310 further includes a command processing circuit 640 that provides the received, decoded, and/or otherwise processed module control signals 330 to the DQ routing circuits 320 and the strobe routing circuit 620 either directly or after further processing, if needed. The received/decoded/processed module control signals may include, for example, one or more enable signals ENA and/or ENB that are used by the DQ routing circuits 320 and the strobe routing circuit 620 to selectively enabling data communication between the MCH 101 and one of the subgroups in the respective group of memory devices, with which the isolation device is associated.

The strobe routing circuit 620 also buffers strobe signals received from either the MCH 101 or the memory devices 112, and output either a write strobe WDQS or read strobe RDQS to the DQ routing circuits 320. In one embodiment, the ID control circuit 310 further includes a delay control circuit 650 that receives one of the module control signals and either a data signal or a strobe signal and determines a delay amount to be used by the DQ routing circuit 320 and the strobe routing circuit 620. The delay amount is provided to the DQ routing circuit 320 and the strobe routing circuit in a delay signal DS.

Figure 7:
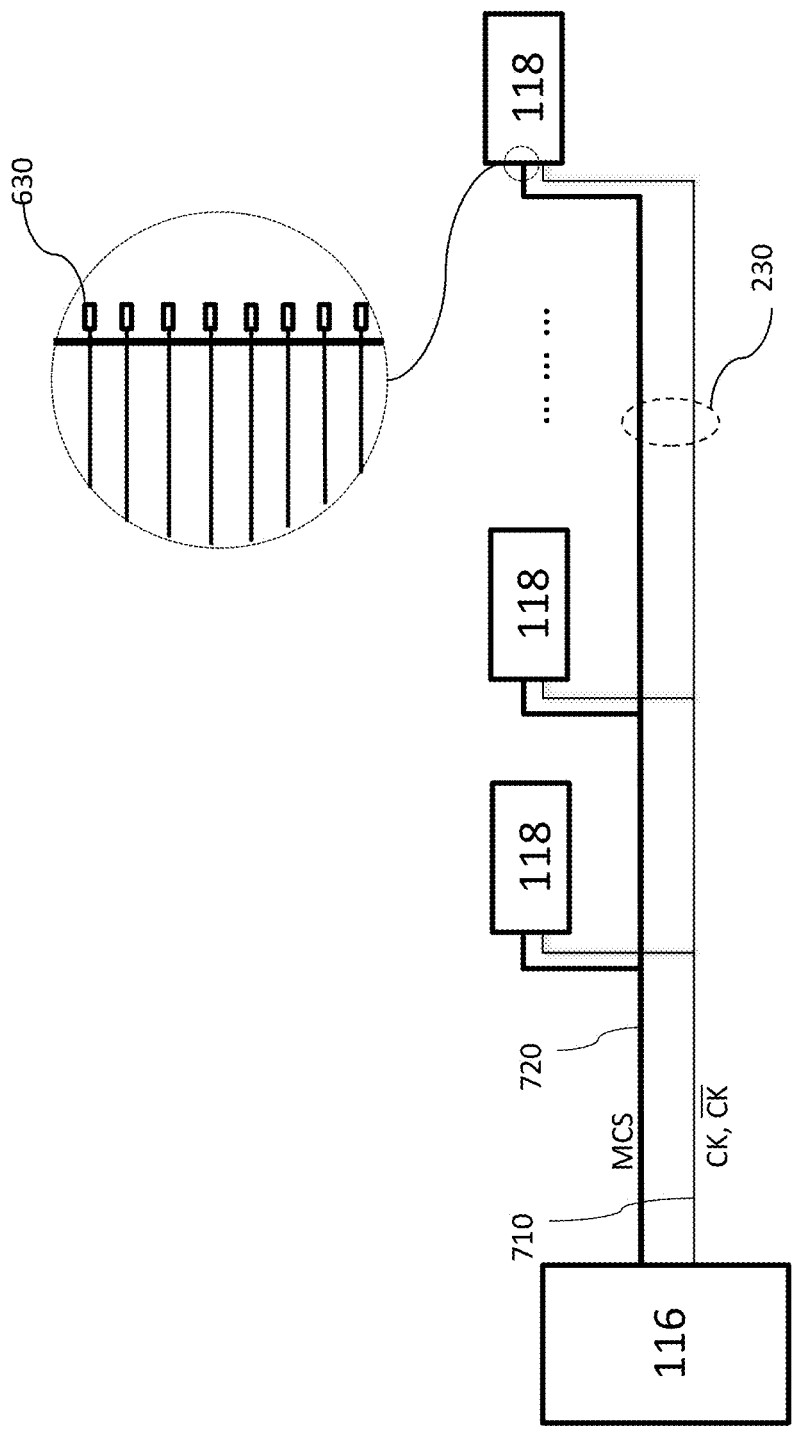
FIG. 7 is a diagram illustrating control signals from a module control device to a plurality of data buffers in a memory module according to certain embodiments.

In a receiver circuit 630, the respective MCS is received in accordance with the module clock signal CK0. In one embodiment, receiver circuit 630 samples the respective MCS using rising (or falling) edges of the module clock CK0. Since the isolation devices 118 are distributed across the memory module 110 at positions corresponding to the respective groups of memory devices, the module control signal lines 230 that carry the MCS to the isolation devices can stretch over a distance of more than 10 centimeters, as shown in FIG. 7. As the MCS and CK0 travel along their respective module control signal lines 710 and 720, they can become misaligned with each other when they reach the input pins 730 of an isolation device 118.

Figure 8:
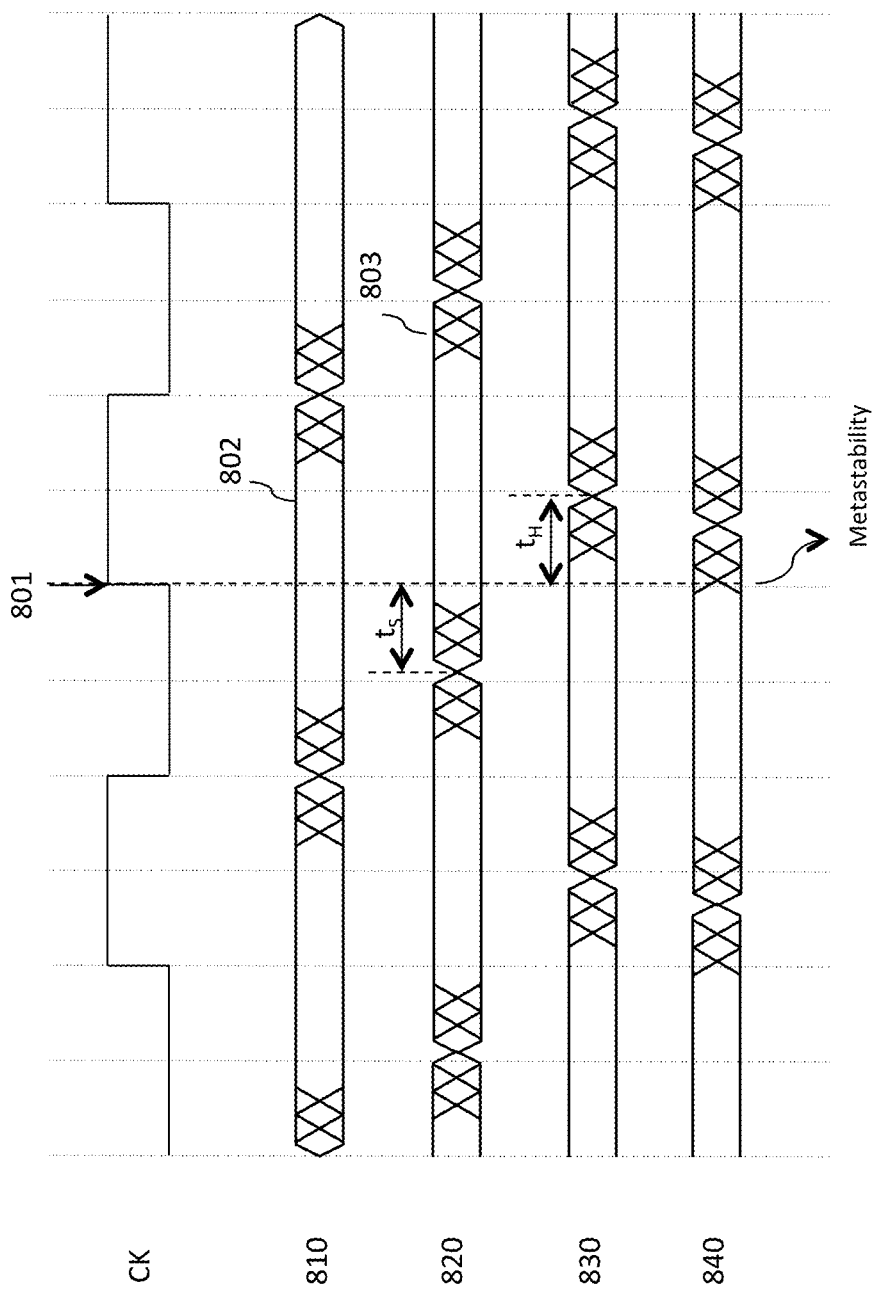
FIG. 8 is a timing diagram illustrating alignment of module control signals with respect to module clock signals.

For example, a module control signal, like the MCS 810 shown in FIG. 8, can be perfectly aligned with the module clock signal CK, with a rising edge 801 of the module clock signal CK being at a center of a data eye 802, when the MCS signal and the clock signal leave the module control circuit 116. When the module control signal and the module clock signal reach an isolation device, however, their alignment can become shifted like the MCS 820 with respect to the CK signal, i.e., the rising edge 801 of the clock signal is near a left edge of a data eye of the MCS 820, barely providing enough set up time for proper sampling of the module control signal. Or, the module control signal, like the MCS 830, can be shifted with respect to the module clock signal such that a rising edge 801 of the clock signal is near a right edge of a data eye of the MCS, barely providing enough hold time for proper sampling of the module control signal. Or, ever worse, the module control signal, like the MCS 840, can be so shifted with respect to the module clock signal such that a rising edge 801 of the clock signal falls in the glitches 803 at the edge of a data eye of the MCS, meaning that the sampled results could be metastable.

Figure 9:
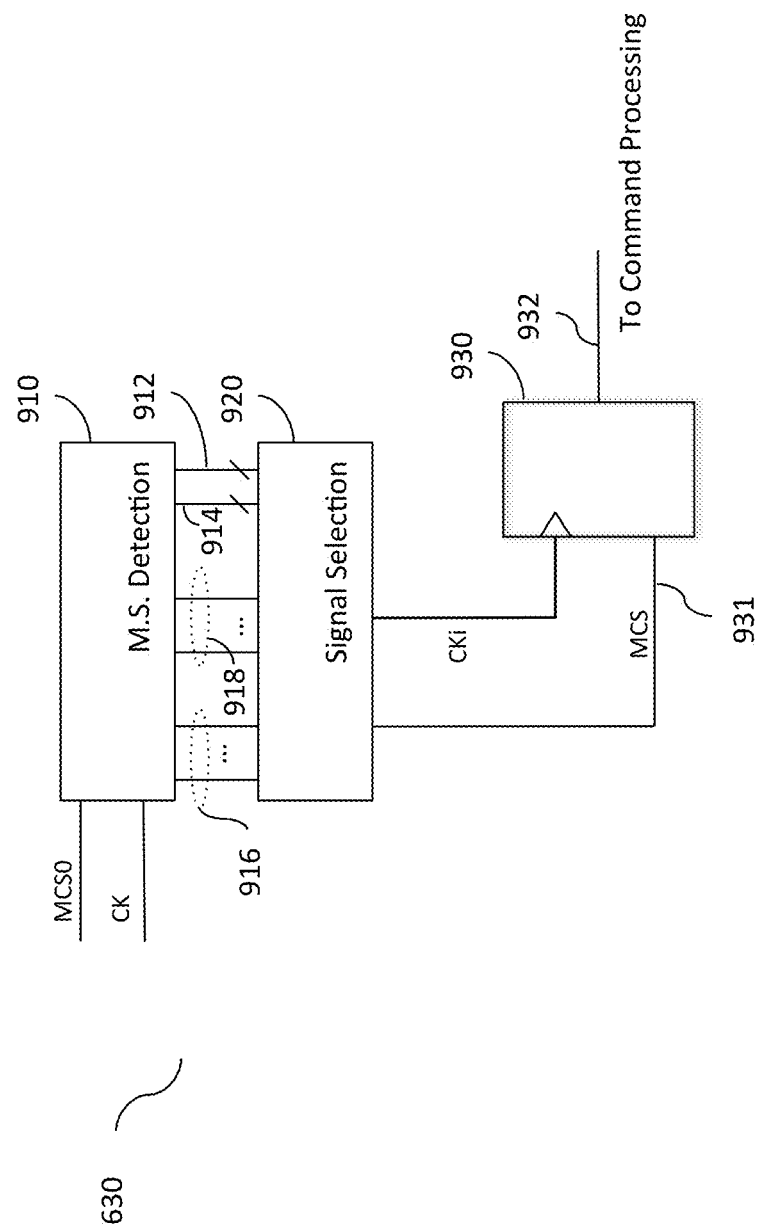
FIG. 9 is a diagram illustrating a metastability detection circuit and signal adjustment circuit in a data buffer according to certain embodiments.

In one embodiment, as shown in FIG. 9, a receiver circuit 630 includes a metastability detection circuit (MDC) 910 to determine a metastability condition in a corresponding module control signal MCS0. In one embodiment, the MDC 910 generates at least one delayed version of the module clock signal CK and at least one delayed version of the corresponding MCS0. The MDC 910 also generates one or more metastability indicators and outputs the one or more metastability indicators via lines 912 and/or 914.

The receiver circuit 630 further includes a signal selection circuit 920 that receives the module clock CK and the at least one delayed version of the module clock via signal lines 916. The signal selection circuit 920 also receives the corresponding MCS and the at least one delayed version of the corresponding MCS via signal lines 918. The signal selection circuit 920 selects a clock signal CK$_i$ from among the module clock CK and the at least one delayed version of the module clock based on one or more of the metastability indicators. The signal selection circuit 920 may also select an MCS signal MCS$_i$ from among the corresponding MCS and the at least one delayed version of the corresponding MCS based on at least one other metastability indicator.

The receiver circuit 630 further includes a sampler or register circuit 930 that samples the selected module control signal MCS$_i$ according to the selected clock signal CK$_i$ and outputs the sampled signal as the received module control signal, which is provided to the command processing circuit 640 for further processing (if needed) before being provided to the DQ routing circuits 320 and DQS routing circuit 620.

Figure 10B:
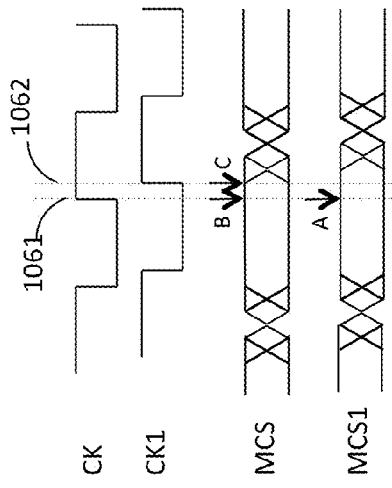
FIGS. 10A-10C are diagrams illustrating a metastability detection circuit according to certain embodiments.
Figure 10C:
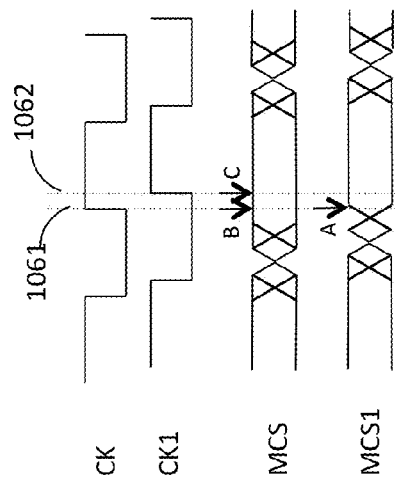
Figure 10A:
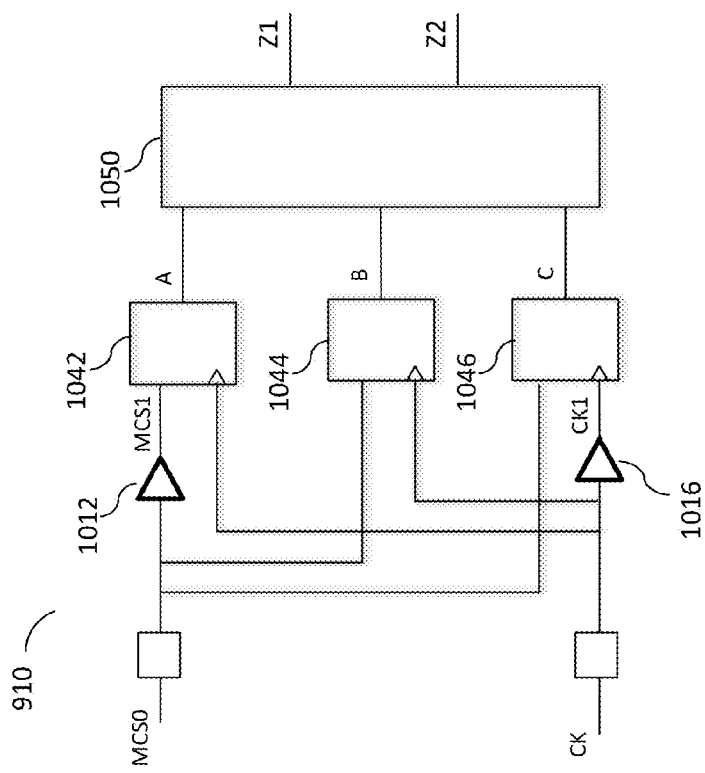

FIG. 10A illustrates an MDC 910 according to one embodiment. As shown, the MDC 910 includes a delay circuit 1012 that generates a delayed version MCS1 of the corresponding MCS0 by adding a predetermined amount of delay (e.g., 10ps) to MCS0. MDC 910 also includes a delay circuit 1016 that generates a delayed version CK1 of the clock signal CK0 by adding a predetermined amount of delay to CK0. In one embodiment, CK1 is delayed from CK0 by about 1/10th of a clock cycle, e.g., 50-70 ps for an operating frequency of about 1600 MHz. The MDC 910 further includes a sampler circuit 1042 that samples MCS1 according to CK0 and outputs a sampled result A, a sampler circuit 1044 that samples MCS0 according to CK0 and outputs a sampled result B, and a sampler circuit 1046 that samples MCS0 according to CK1 and outputs a sampled result C. The MDC 910 further includes a logic circuit (e.g., a majority decision circuit) that generates metastability indicators Z1 and Z2 based on the sampled results A, B, and C.

In one embodiment, Z1 is the result of a logic operation (e.g., an XNOR operation) on the sampled result, e.g., Z1= $\overline{A \oplus B}$, and Z2 is the result of another logic operation on the sampled results, e.g., Z2=$\overline{B \oplus C}$. Thus, as shown in FIG. 10B and Table 1 below, when a metastability condition of insufficient hold time occurs, i.e., a rising clock edge 1061 of CK0 is close to the right side of a data eye where glitches at the edges of the data eyes can make C unpredictable, A and B can be in agreement (i.e., Z1 is true) while B and C are likely not in agreement (i.e., Z2 is false). FIG. 10 C illustrates a metastability condition when there is insufficient set-up time. As shown in FIG. 10C and Table 1 below, a rising clock edge 1061 of CK0 is close to the left side of a data eye where glitches at the edges of the data eyes can make A unpredictable. Thus, A and B can be in disagreement so Z1 is false while B and C can be in agreement so Z2 is true. Not shown in the figures is the situation that all A, B, and C are in agreement, meaning that both the rising clock edge 1061 of CK0 and the rising clock edge 1062 of CK1 are near the middle of an MCS0 data eye so there is no metastability issues and both Z1 and Z2 are true, as shown in Table 1.

Figure 10D:
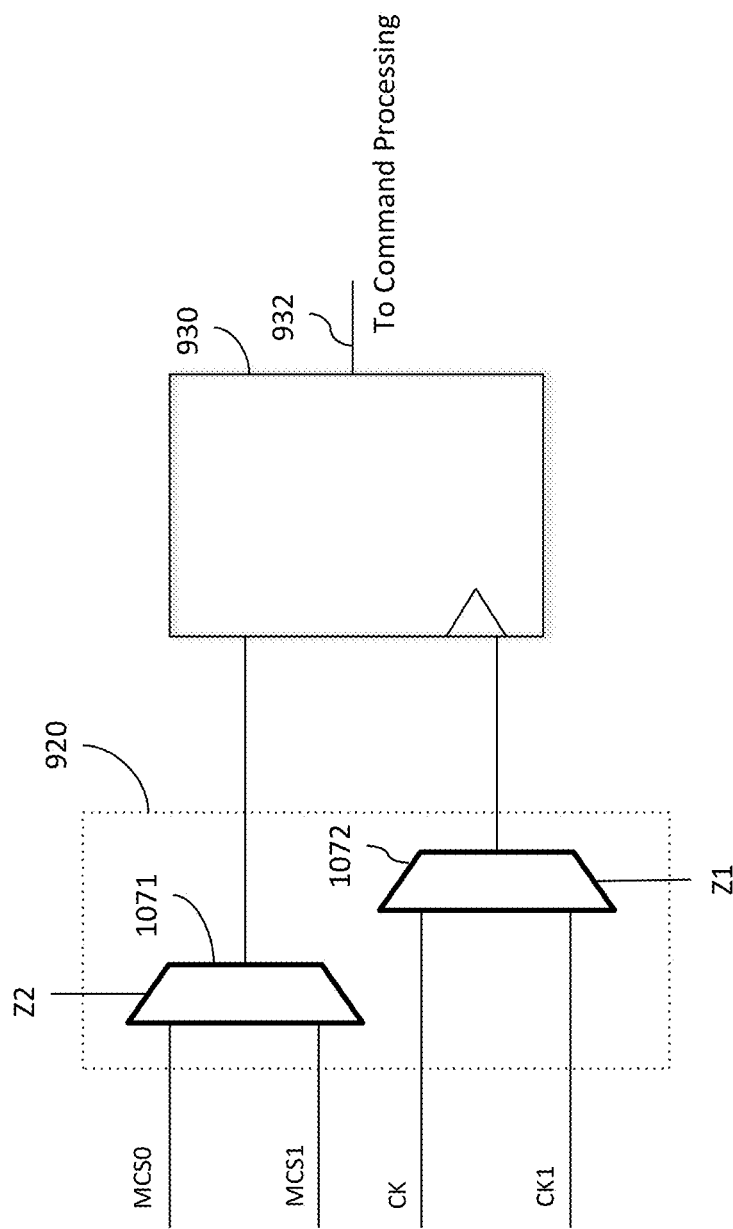
FIG. 10D is a diagram illustrating a signal adjustment circuit according to certain embodiments.

FIG. 10D illustrates a signal selection circuit 920 according to an embodiment. As shown, in one embodiment, the signal selection circuit 920 includes a first multiplexor 1071 that selects between CK0 and CK1 based on the metastability indicator Z1, and a second multiplexor 1072 that selects between MCS0 and MCS1 based on the metastability indicator Z2. Thus, as shown in Table 1, where a metastability condition of insufficient hold time occurs, Z1=1 and Z2=0, and MCS1 is output from multiplexor 1071 while CK0 is output from multiplexor 1072. Sampler 930 thus samples MCS1 according to the rising edges of CK0. Thus, more hold time is provided to mitigate the metastability condition since MCS1 is shifted from MCS0 toward the right.

On the other hand, where a metastability condition of insufficient set-up time occurs, Z1=0 and Z2=1, and CK1 is output from multiplexor 1071 while MCS0 is output from multiplexor 1072. Sampler 930 thus samples MCS0 according to the rising edges of CK1. Since CK1 is shifted from CK0 toward the right, more set-up time is provided to mitigate the metastability condition.

In the case when no metastability is detected, Z1=1 and Z2=1, and CK0 is output from multiplexor 1071 while MCS0 is output from multiplexor 1072. So, the unshifted module control signal is sampled according to the unshifted module clock signal.

TABLE 1

Metastability Detection and Signal Selection

| Sampler Output | | | MS Indicators | | | Signal Selection | |
|---|---|---|---|---|---|---|---|
| A | B | C | Z1 | Z2 | MS Condition | CK | MCS |
| D1 | D1 | D2 | 1 | 0 | insufficient hold time | CK0 | MCS1 |
| D1 | D2 | D2 | 0 | 1 | insufficient set-up time | CK1 | MCS0 |
| D1 | D1 | D1 | 1 | 1 | no metastability | CK0 | MCS0 |

Figure 11A:
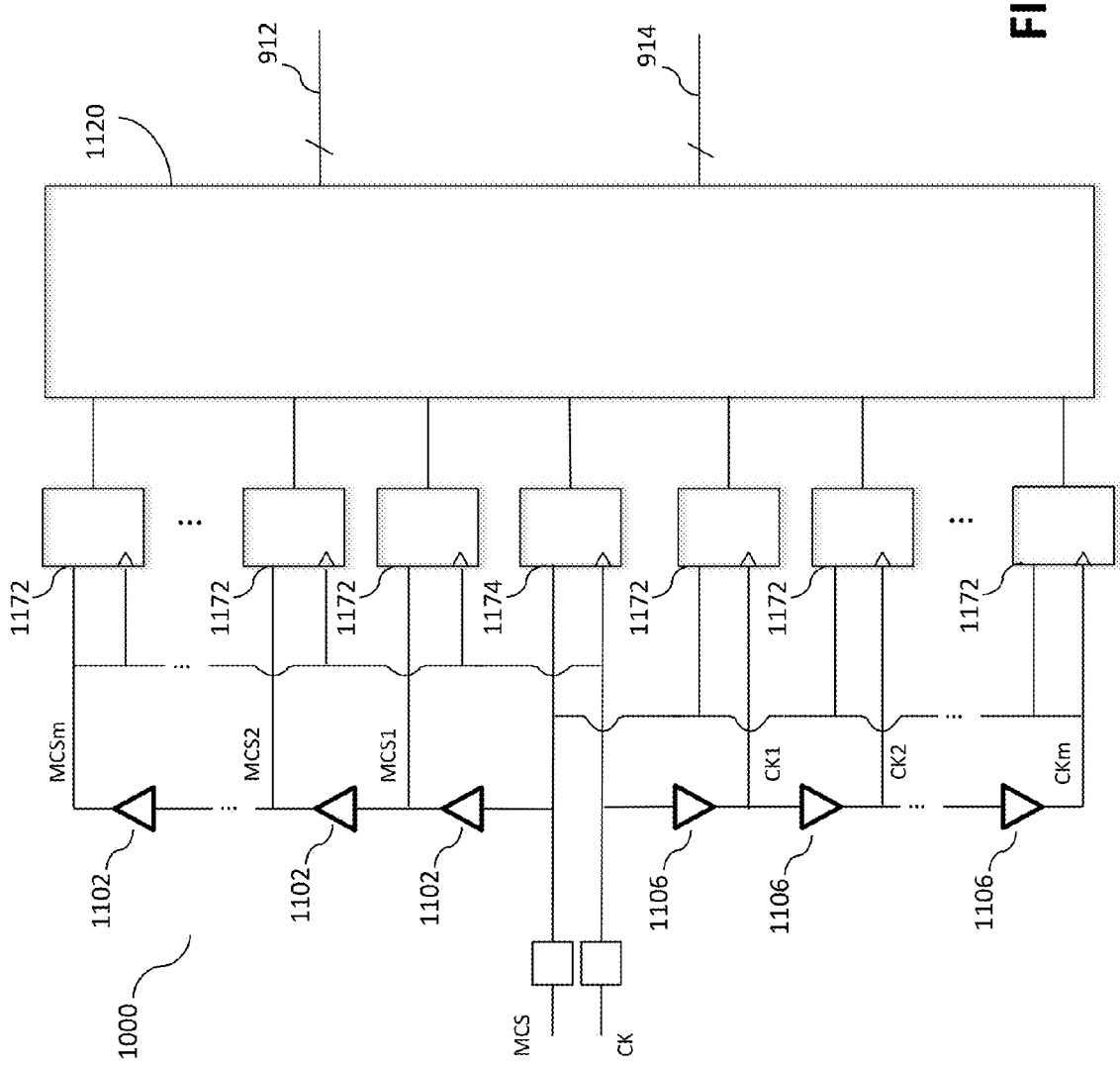
FIGS. 11A-11B are diagrams illustrating a metastability detection circuit and signal adjustment circuit, respectively, according to certain embodiments.

FIGS. 10A-10D illustrate a relatively simple implementation of the metastability detection circuit (MDC) 910 where only three different sample points are provided to detect metastability condition in the module control signal. In general, the MDC 910 may generate more delayed versions of the module clock signal CK0 and/or the corresponding module control signal MCS0, and may include more sampler circuits to sample any additional delayed versions of the module control signal according to either the module clock signal or one of the delayed versions of the module clock signal. For example, as shown in FIG. 11A, the MDC 910 can include a plurality of delay circuits 1102 that generate m delayed versions of MCS0, e.g., MCS1, MCS2, . . . MCSm, and m delayed versions of CK0, e.g., CK1, CK2, . . . , CKm. The MDC 910 can include sampler circuits 1104 that sample MCS0 according to CK0, CK1, . . . , CKm, respectively, and sampler circuits 1104 that sample MCS0, MCS1, MCS2, . . . MCSm according to CK0, respectively. The outputs of the samplers 1104 are provided to a logic circuit 1120, which determines a metastability condition in MCK0 based on the sampler outputs using, for example, a majority decision logic. The logic circuit 1120 outputs a first metastability indicator on line(s) 912 and a second metastability indicator on line(s) 914.

Figure 11B:
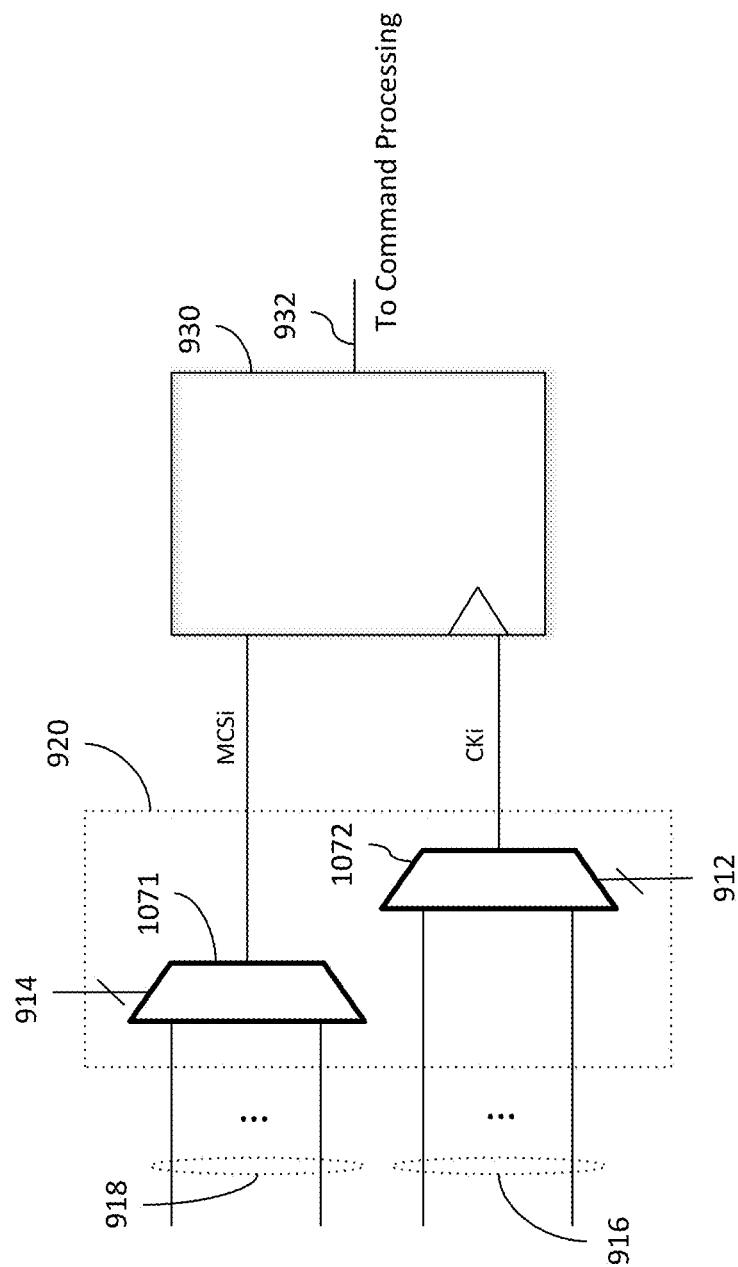

FIG. 11B illustrates a signal selection circuit 920 according to an embodiment. As shown, in one embodiment, the signal selection circuit 920 includes a first multiplexor 1171 that selects between CK0, CK1, . . . , CKm based on the metastability indicator provided on line(s) 912, and a second multiplexor 1172 that selects between MCS0, MCS1, . . . , MCSm based on the metastability indicator provided on line(s) 914, such that the rising edges of the selected clock signal, e.g., Cki, are close to the middle of the respective data eyes in the selected module control signal, e.g., MCSi. The selected signals MCSi and Cki are provided to the sampler 930, which samples MCSi according to the rising edges of CKi.

As stated above, in certain embodiments, since the isolation devices 118 are in the data paths between the MCH 101 and the respective groups of memory devices 112, the MCH 101 does not have direct control of the memory devices 112. Thus, conventional read/write leveling techniques are not sufficient for managing read/write data timing. In one embodiment, the isolation devices 118 includes signal alignment mechanism to time the transmission of read data signals based on timing information derived from a prior write operation, as discussed further below.

Figure 12A:
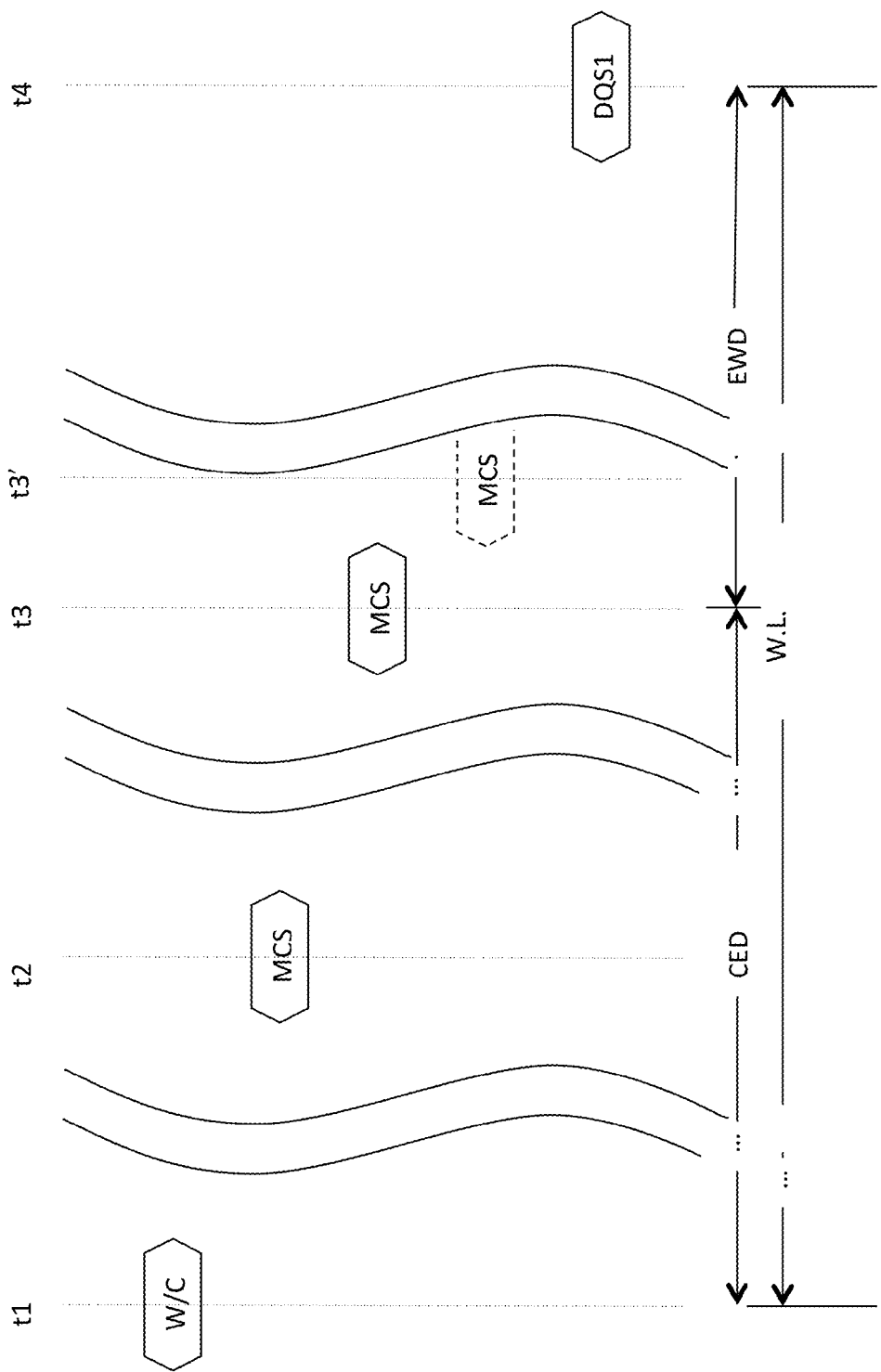
FIGS. 12A-12B are a timing diagrams illustrating a write operation and a read operation, respectively, performed by a memory module according to one embodiment.

FIG. 12A is a timing diagram for a write operation according to one embodiment. As shown, after a write command W/C associated with the write operation is received by the module control circuit 116 at time t1, the module control circuit 116 outputs one or more enable signals EN at time t2 in response to the write commands. The one or more enable signals are received by an isolation device 118 at time t3, which afterwards receives one or more strobe signal DQS from the MCH 101 at time t4. Note that the same enable signal may be received by another isolation device 118 at time t3', which can be in a different cycle of the system clock MCK from the cycle which t3 is in. The time interval between t4 and t1 is consistent with a write latency W.L. associated with the system 100, and is controllable by the MCH 101 and knowable to the isolation device 118. The time interval between t4 and t3, referred to hereafter as an enable-to-write data delay EWD, can be determined by the isolation device 118 since both these signals are received by the isolation device. Based on such determination, the isolation device 118 can have knowledge of the time interval between t3 and t1, referred to hereafter as a command-to-enable delay CED, which can be used by the isolation device 118 to properly time transmission of read data to the MCH, as explained further below.

Figure 12B:
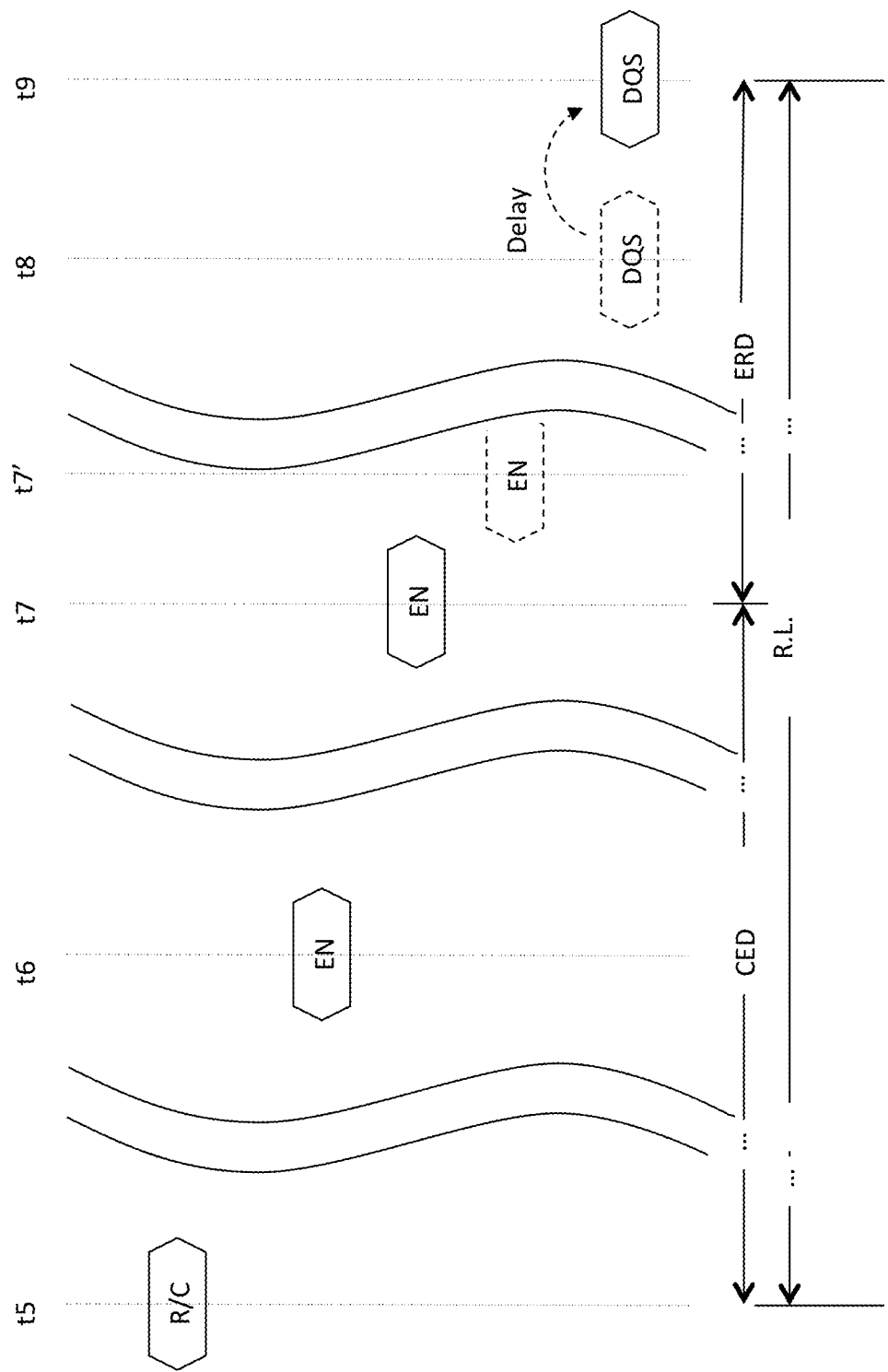

FIG. 12B is a timing diagram for a read operation according to one embodiment. As shown, after a read command R/C associated with the read operation is received by the module control circuit 116 at time t5, the module control circuit 116 outputs one or more enable signals EN at time t6 in response to the read commands. The one or more enable signals are received by an isolation device 118 at time t7, which afterwards receives at time t8 read data signals (not shown) and one or more strobe signal DQS from the respective group of memory devices. Note that the same enable signal may be received by another isolation device 118 at time t3', which can be in a different cycle of the system clock MCK from the cycle which t3 is in. Thus, the enable signals alone cannot be used to time the transmission of the read signals by the isolation devices 118.

With knowledge of the time interval between t7 and t5, which should be about the same as the time interval between t3 and t1, i.e., the command-to-enable delay CED, in certain embodiments, the isolation device can add a proper amount of delay to the read data signals and the one or more DQS signal such that the read data signals and the one or more DQS signal are transmitted at time t9 by the isolation device to the MCH 101 via the respective group of data/strobe signal lines 130, with the time interval between t9 and t5 being consistent with a read latency R.L. associated with the system 100.

Figure 13:
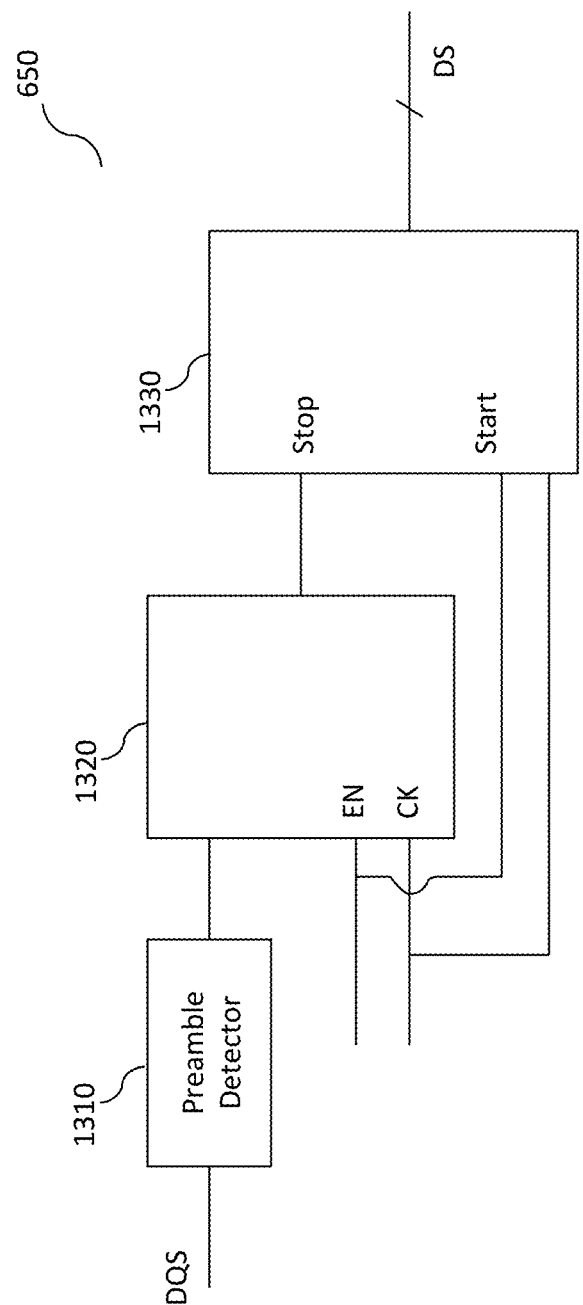
FIG. 13 is a diagram illustrating a delay control circuit in a data buffer according to certain embodiments.

The time interval between t4 and t3, i.e., the enable to write data delay EWD, is determined by the delay control circuit 650 in the ID control circuit 310, as shown in FIG. 6. According to one embodiment, as shown in FIG. 13, the delay control circuit 650 includes a preamble detector 1310 to detect a write preamble in the DQS, a flip-flop circuit 1320 having an enable input EN receiving one of the module control signals and a clock input CK receiving the buffered module clock signal CK0, and a counter circuit 1330 having a Start input receiving the one of the module control signals, a Stop input receiving an output of the flip-flop circuit 1320. Thus, the output of the counter circuit, i.e., the delay signal DS, would indicate a time interval from when the write preamble is detected and when the one of the module control signal is received.

Figure 14:
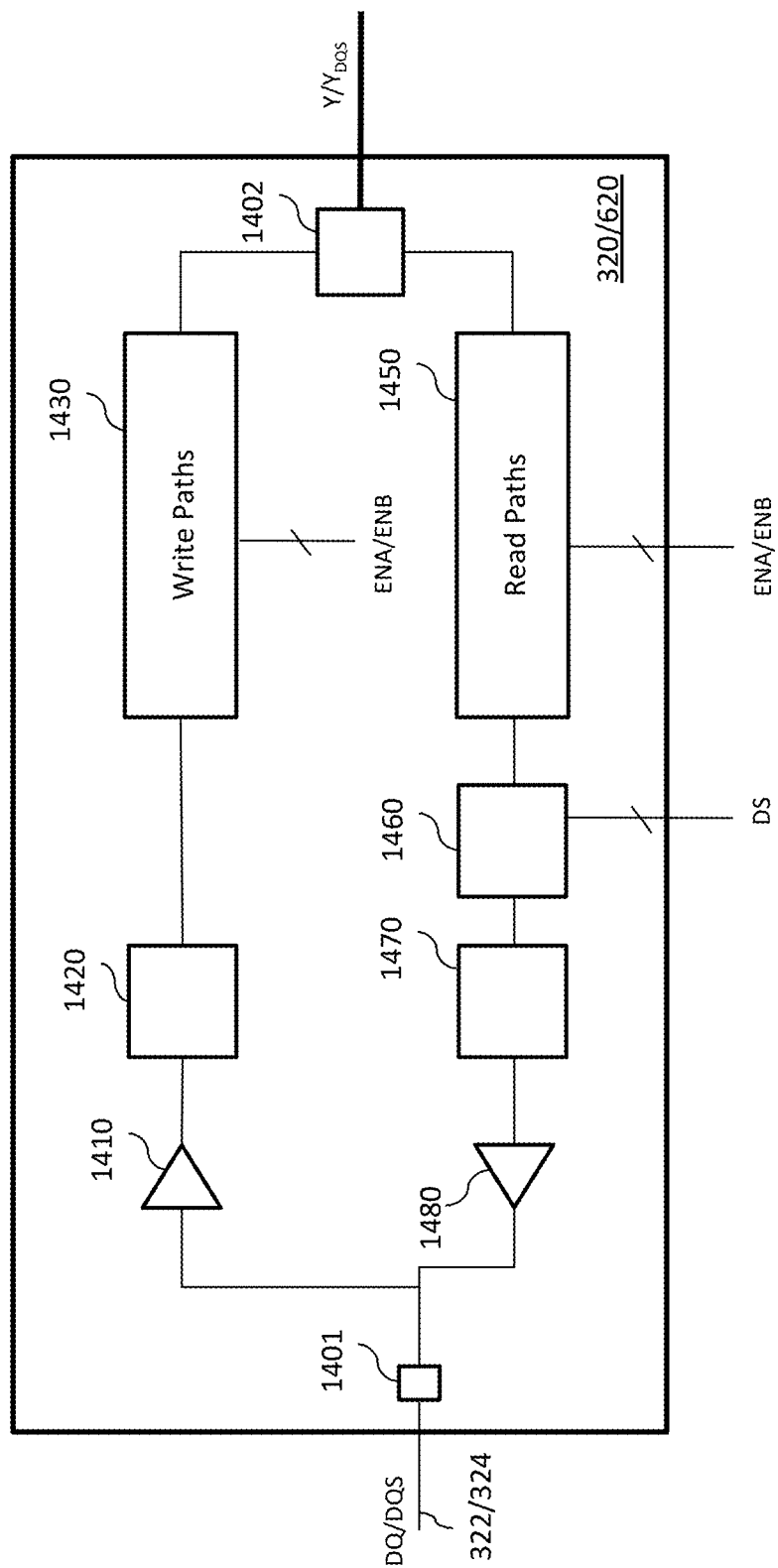
FIG. 14 is a diagram illustrating a DQ or DQS routing circuit in a data buffer according to an embodiment.

FIG. 14 illustrates a DQ or DQS routing circuit 320 or 620 according to an embodiment. As shown, the DQ/DQS routing circuit 320/620 includes a DQ/DQS pin 1401 that is coupled to the corresponding DQ/DQS signal line 322/324, a set of one or more DQS pins 1402 that is coupled to a corresponding module DQ/DQS line(s) Y/$Y_{DQS}$, or YA/$YA_{DQS}$ and YB/$YB_{DQS}$. The DQ/DQS routing circuit 320/620 further includes a write strobe buffer 1410 that buffers write data/strobe, and a write data/strobe receiver 1420 that samples the write data/strobe. The DQ/DQS routing circuit 320/620 further includes a plurality of write paths 1430 that are selectable or can be selectively enabled by one or more of the module control signals, such as the enable signals ENA and ENB.

The DQS routing circuit further includes a plurality of read paths 1450 that are selectable by the one or more of the module control signals. Output from the selected read path is delayed in a delay circuit 1460 by an amount controlled by the delay signal DS, and sampled by a sampler circuit 1470. The sampled read data/strobe is transmitted by transmitter 1480 onto the corresponding data/strobe signal line 322/324 via the DQ/DQS pin 1401.

Figure 15:
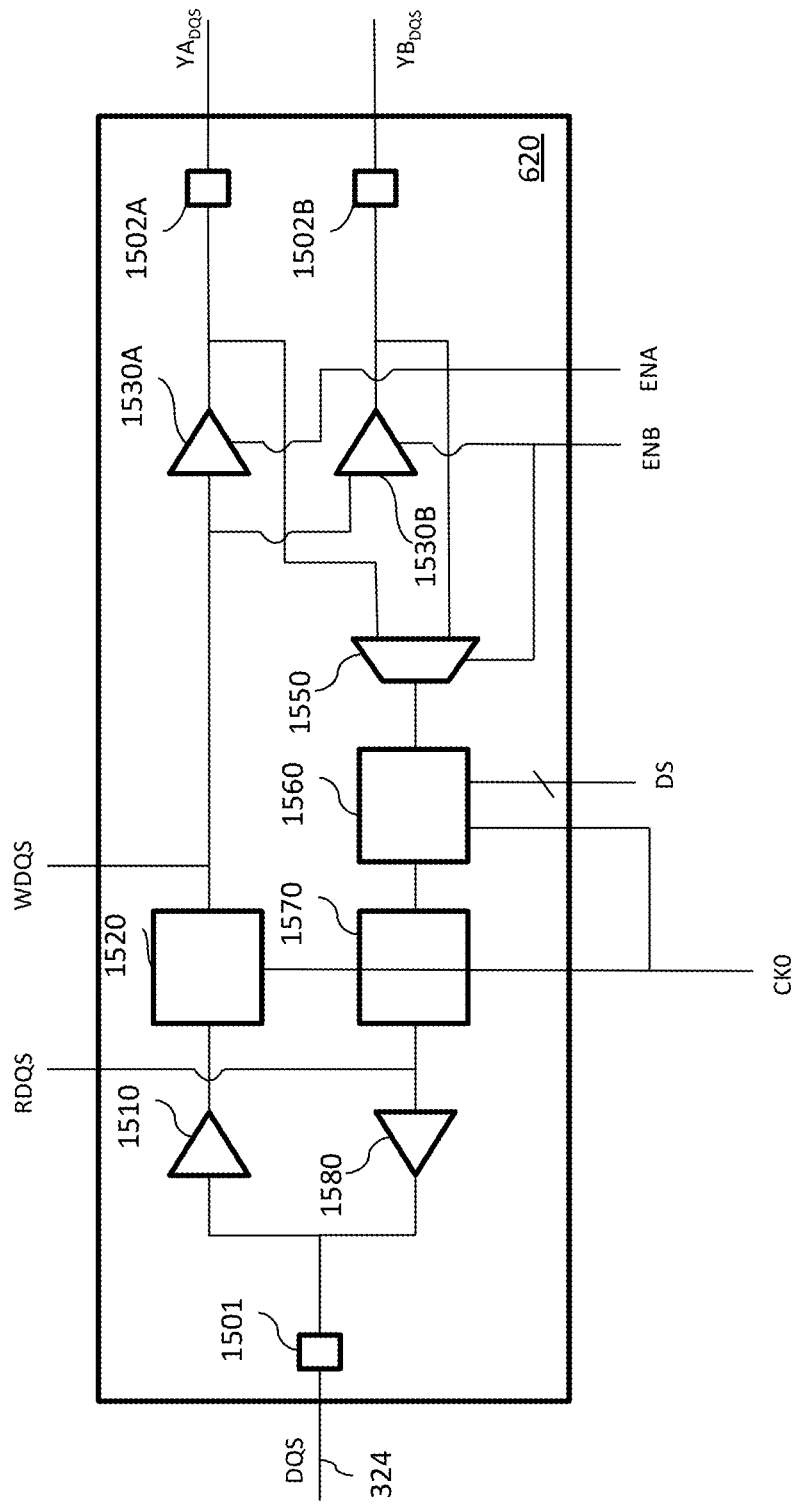
FIG. 15 a diagram illustrating a DQS routing circuit having a delay circuit in a data buffer according to an embodiment.

FIG. 15 illustrates a DQS routing circuit 620 according to an embodiment. As shown, the DQS routing circuit 620 includes a first DQS pin 1501 that is coupled to a corresponding DQS signal line 324, a second DQS pin 1502A that is coupled to a corresponding module DQS line $YA_{DQS}$, a third DQS pin 1502B that is coupled to a corresponding module DQS line $YB_{DQS}$. The DQS routing circuit 620 further includes a first write strobe path coupled between the first DQS pin 1501 and the second DQS pin 1502A and a second write strobe path coupled between the first DQS pin 1501 and the third DQS pin 1502B. The first write strobe path includes a write strobe buffer 1510 that buffers a write strobe, a write strobe receiver 1520 that samples the write strobe according to the buffered module signal CK0. The sampled write strobe is provided to the DQ routing circuits 320 as the write strobe WDQS. The first write strobe path further includes a first write strobe transmitter 1530A that transmits the write strobe to one or more memory devices 112 coupled to the module strobe line $YA_{DQS}$. The second write strobe path includes the write strobe buffer 1510, the write strobe receiver 1520, and a second write strobe transmitter 1530B that transmits the write strobe to one or more memory devices 112 coupled to the module strobe line $YB_{DQS}$. The first and second write strobe transmitters, 1530A and 1530B, are controlled by two enable signals, ENA and ENB, respectively, such that the first write strobe path and the second write strobe path can be selectively enabled/disabled by the enable signals, ENA and ENB.

The DQS routing circuit further includes a read strobe path coupled between the first DQS pin 1501 and a selected one of the second and third DQS pins 1502A and 1502B. In the read strobe path, a select circuit 1550 (e.g., a multiplexor) selects either a read strobe signal received via DQS pin 1502A or a read strobe signal received via DQS pin 1502B based on one or both of the enable signals ENA or ENB. The selected read strobe signal is delayed in a delay circuit 1560 by an amount controlled by the delay signal DS, and sampled by a sampler circuit 1570 according to the buffered module clock signal CK0. The sampled read strobe is provided to the DQ routing circuits 320 as the read strobe RDQS and is transmitted by transmitter 1580 onto the corresponding strobe signal line 324 via the first DQS pin 1501.

Figure 16:
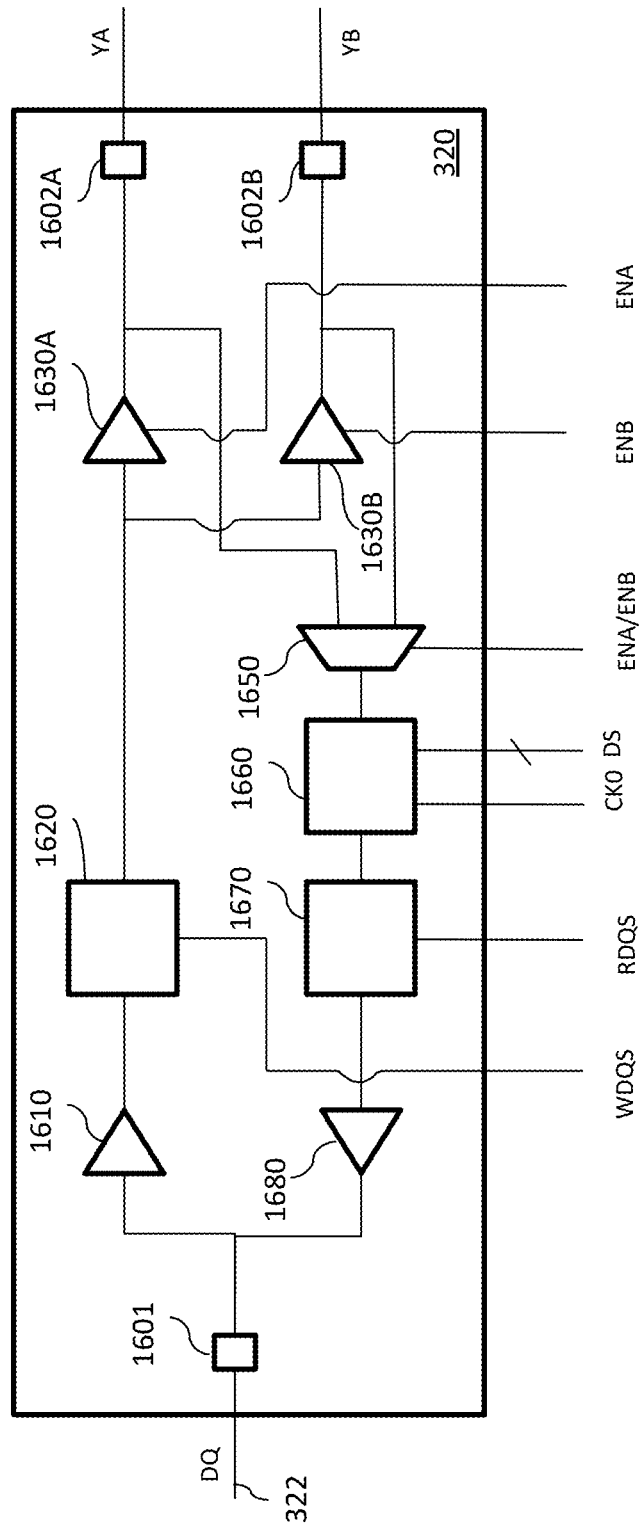
FIG. 16 a diagram illustrating a DQ routing circuit having a delay circuit in a data buffer according to an embodiment.

FIG. 16 illustrates a DQ routing circuit 320 according to an embodiment. As shown, the DQ routing circuit 320 includes a first DQ pin 1601 that is coupled to a corresponding DQ signal line 130, a second DQ pin 1602A that is coupled to a corresponding module DQ line $YA_{DQ}$, a third DQ pin 1602B that is coupled to a corresponding module DQ line $YB_{DQ}$. The DQ routing circuit 320 further includes a first write data path coupled between the first DQ pin 1601 and the second DQ pin 1602A and a second write data path coupled between the first DQ pin 1601 and the third DQ pin 1602B. The first write data path includes a write data buffer 1610, a write data receiver 1620 that samples write data according to the write strobe WDQS from the DQS routing circuit 620, and a first write data transmitter 1630A that transmits the write data to one or more memory devices 112 coupled to the module data line $YA_{DQ}$. The second write data path includes the write data buffer 1610, the write data receiver 1620, and a second write data transmitter 1630B that transmits the write data to one or more memory devices 112 coupled to the module data line YB$_{DQ}$. The first and second write data transmitters, 1530A and 1530B, are controlled by two enable signals, ENA and ENB, respectively. Thus, the first write data path and the second write data path can be selectively enabled/disabled by the enable signals, ENA and ENB.

The DQ routing circuit further includes a read data path coupled between the first DQ pin 1601 and a selected one of the second and third DQ pins 1602A and 1602B. In the read data path, a select circuit 1650 (e.g., a multiplexor) selects either a read data signal received via DQ pin 1602A or a read data signal received via DQ pin 1602B based on one or both of the enable signals ENA or ENB. The selected read data signal is delayed in a delay circuit 1660 by an amount controlled by the delay signal DS. The delayed read data signal is then sampled by a receiver circuit 1670 according to the read strobe RDQS from the DQS routing circuit 620, and transmitted by transmitter 1680 onto the corresponding data signal line 130 via the first DQ pin 1601.

Figure 17:
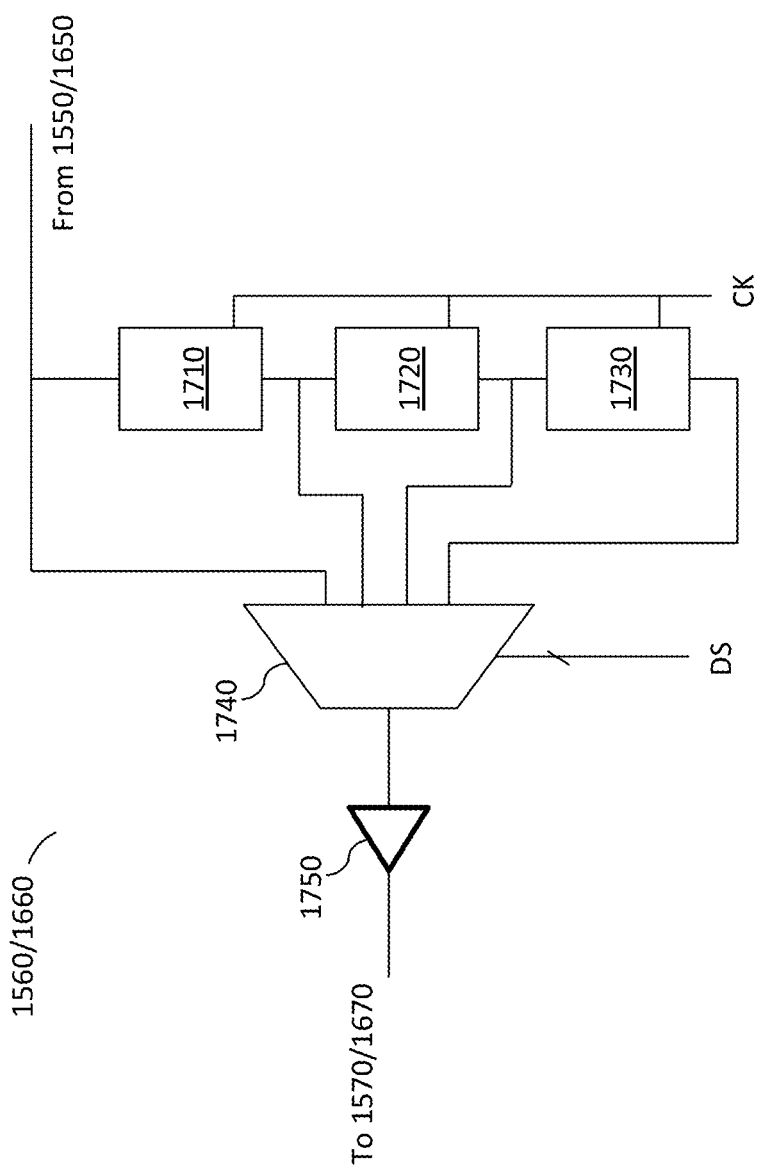
FIG. 17 is a diagram illustrating a delay circuit in a DQ or DQS routing circuit according to an embodiment.

FIG. 17 illustrate a delay circuit 1560 or 1660 according to an embodiment. As shown, the delay circuit 1560 or 1660 includes a plurality of delay stages, such as delay stages 1710, 1720, and 1730, each delaying a read data or read strobe signal from the select circuit 1550/1650 by a predetermined amount. The delay circuit 1560 or 1660 further includes a select circuit 1740 (e.g., a multiplexor) that selects from among the read data or read strobe signal and the outputs from the delay stages according to the delay signal DS. The output of the select circuit 1740, is provided to the sampler circuit 1570 or 1670, either directly or after being buffered by a buffer circuit 1750.

Figure 18:
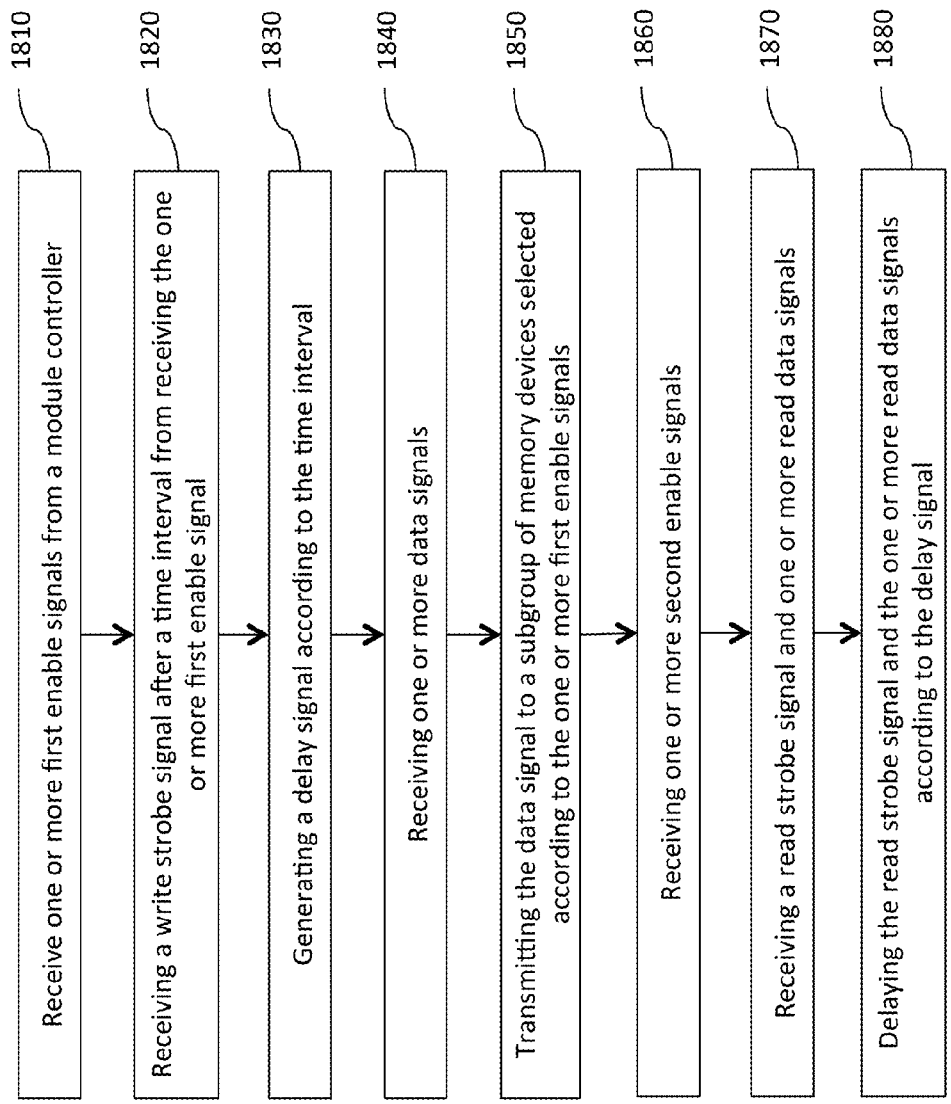
FIG. 18 is a flowchart illustrating a method for data edge alignment according to embodiments.

Thus, as shown in FIG. 18, in one embodiment, a memory module 110 operates in the memory system 100 according to a method 1800. In the method, during a write operation, one or more module control signals are received by an isolation device 118 from a module control circuit or module controller 116 (1810). The module controller 116 generates the one or more module control signals in response to C/A signals representing a write command from the MCH 101. The one or more module control signals are used to control the isolation device 118. For example, the one or more module control signals may include one or more first enable signals to enable a write path to allow write data be communicated to a selected subgroup of memory devices among the group of memory devices coupled to the isolation device 118. After a time interval from receiving the one or more first enable signals, write data DQ and write strobe DQS are received by the isolation device 118 from the MCH 101 (1820). In one embodiment, upon receiving the one or more first enable signal, a counter is started, which is stopped when the write data DQ or write strobe DQS is received. Thus, a time interval EWD between receiving the one or more first enable signals and receiving the write strobe signal DQS is recorded.

Since the time interval between the arrival of the command signals from the MCH 101 and the arrival of the write data/strobe signal DQ/DQS from the MCH 101 is a set according to a write latency parameter associated with the system 100, the time interval EWD can be used to ascertain a time interval CED between the time when a command signal is received by the memory module 110 and the time when the one or more enable signals are received by the isolation device 118. The time interval CED can be used by the isolation device 118 to properly time the transmission of read data to the MCH 101, as described above and explained further below.

As shown in FIG. 18, a delay signal DS is generated according to the time interval EWD (1830). Concurrent to receiving the write strobe signal DQS, the isolation device 118 also receives a set of write data signals DQ (1840). The received write data signals are transmitted to the subgroup of memory devices (1850), which are selected from the group of memory devices coupled to the isolation device 118 by the one or more first enable signals.

During a read operation, another set of module control signals including, for example, one or more second enable signals, are received by the isolation device 118 from the module controller 116 (1860). The one or more second enable signals are generated by the module controller 116 in response to read command signals received from the MCH 101, and are used by the isolation device 118 to select a subgroup of memory devices from which to receive read data. Afterwards, a read strobe signal DQS and a set of read data signal DQ are received from the selected subgroup of memory devices (1870). To properly time the transmission of the DQS and DQ signals to the MCH 101, the DQS and DQ signals are adjusted (e.g., delayed) according to the delay signal DS, such that the DQS and DQ signals follow a read command by a time interval consistent with a read latency parameter associated with the system 100.

Figure 19:
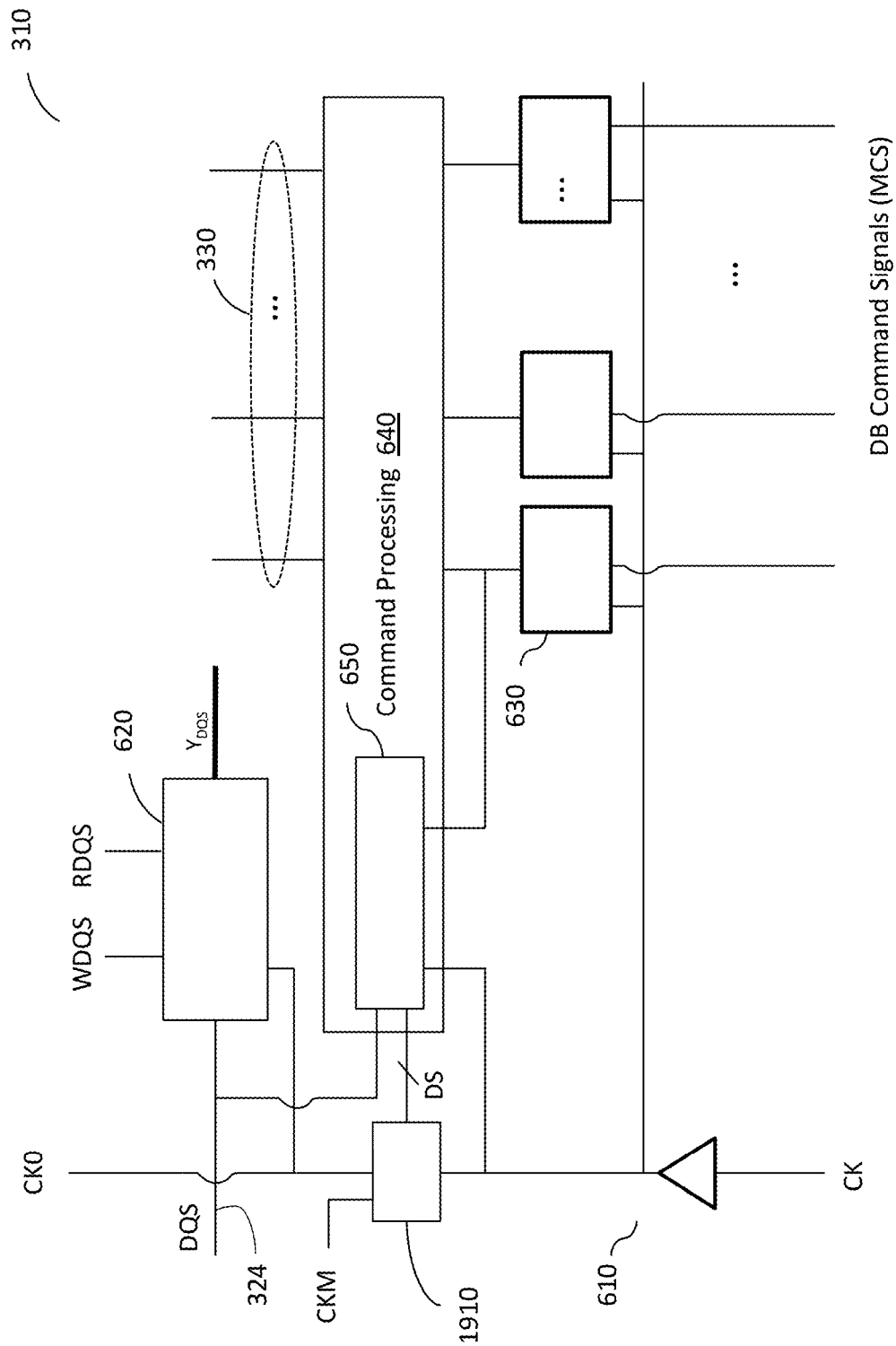
FIG. 19 is a diagram illustrating a control circuit in a data buffer according to certain embodiments.

In certain embodiments, especially the embodiments shown in FIG. 2D, the delay circuits 1560 and 1660 shown in FIGS. 15 and 16 are not needed to provide alignment of the read data. As shown in FIG. 19, the ID control circuit 310 includes a clock regeneration circuit 1920 that regenerates the clock signal CK received from the control circuit 116, according to the delay signal DS. The regenerated clock signals CK0 and CKM each includes a proper amount of delay as compared to the clock signal CK. The clock CK0 is provided to the strobe routing circuit 620 so that the strobe signals are properly timed to result in proper data alignment. The regenerated clock signal CKM is provided to the respective set of memory devices so that the respective data buffer 118 and the respective set of memory devices are locally synchronized.

We claim:

1. A memory module to operate in a memory system with a memory controller, the memory system operating according to a system clock, the memory system including a memory bus coupling the memory module to the memory controller, the memory bus including a set of control/address signal lines and a plurality of sets of data/strobe signal lines, the memory module comprising:

a module control device to receive memory command signals from the memory controller and to output module command signals and module control signals in response to the memory command signals;

memory devices organized in groups, each group including at least one memory device, the memory devices receiving the module command signals from the module control device and performing one or more memory operations in accordance with the module command signals; and a plurality of buffer circuits to receive the module control signals, each respective buffer circuit corresponding to a respective group of memory devices and coupled between the respective group of memory devices and a respective set of the plurality of sets of data/strobe signal lines, the respective buffer circuit including data paths for communicating data between the memory controller and the respective group of memory devices, the data paths being controlled by at least one of the module control signals; and wherein the plurality of buffer circuits are distributed across a surface of the memory module in positions corresponding to respective sets of the plurality of sets of data/strobe signal lines such that each module control signal arrives at the plurality of buffer circuits at different points in time, and wherein the each respective buffer circuit is configured to determine a respective time interval based on signals received by the each respective buffer circuit during a memory write operation and is further configured to time transmission of a respective set of read data signals received from the respective group of memory devices in accordance with the time interval and a read latency parameter of the memory system during a memory read operation.

2. The memory module of claim 1, wherein each module control signal arrives at the plurality of buffer circuits at different points in time across more than one clock cycle of the system clock, and wherein the each respective buffer circuit is configured to align the respective set of read data signals such that different sets of read data signals corresponding to the memory read operation are transmitted by the different buffer circuits onto different sets of data/strobe signal lines in the memory bus within one system clock cycle.

3. The memory module of claim 1, wherein each buffer circuit includes receiver circuits to receive corresponding ones of the module control signals, each receiver circuit including a metastability detection circuit to detect metastability condition in the corresponding module control signal, and wherein each buffer circuit further includes at least one signal adjustment circuit to adjust one or more the module control signals to mitigate any metastability condition in the module control signals.

4. The memory module of claim 1, wherein the module control device further receives the system clock from the system memory controller and transmits a registered clock signal to the plurality of buffer circuits, and wherein the each respective buffer circuit regenerates one or more clock signals from the registered clock signal and provides a regenerated clock signal to the respective group of memory devices.

5. The memory module of claim 1, wherein the respective buffer circuit comprises:
a time interval determination circuit to receive, during a write operation, a first signal from the module controller and a second signal from the memory bus and to generate a delay signal indicating a time interval between the first signal and the second signal;
a delay circuit to delay the respective set of read data signals received from the respective group of memory devices according to the delay signal.

6. A method of operating a memory module in a memory system having a memory controller, the memory module being coupled to the memory controller via a memory bus, the memory bus including a set of control/address signal lines and a plurality of sets of data/strobe signal lines, the memory module including memory devices and a module controller coupled to the memo controller via the set of control/address signal lines, the method comprising:
receiving a read command from the memory controller via the set of control/address signal lines;
generating module command signals and module control signals in response to the read command;
producing read data from the memory devices in response to the module command signals;
controlling a plurality of sets data paths in a plurality of data buffers using the module control signals such that each respective set of the plurality of sets of data paths receive and conduct a respective portion of the read data; and outputting read data from the plurality of data paths onto the memory bus, wherein a first set of the plurality of data paths output a first portion of the read data onto a first set of data/strobe signal lines in accordance with a first time interval, wherein a second set of the plurality of data paths output a second portion of the read data onto a second set of data/strobe signal lines in accordance with a second time interval different from the first time interval, the first time interval and the second time interval having been determined during a prior write operation performed in the memory system.

7. The method of claim 6, further comprising:
determining a metastability condition associated with a respective module control signal at each of the plurality of data buffers; and
adjusting the respective module control signal based on the metastability condition.

8. The method of claim 6, further comprising, in the each data buffer:
receiving at least one first module control signal generated in the memory module in response to a write command associated with the prior write operation;
determining a time interval between receiving the at least one first module control signal and receiving a write signal associated with the write command from the memory controller, the write signal being one of a write data signal and a write strobe signal; and
delaying at least one signal in the respective data buffer according to the time interval.

9. The method of claim 8 wherein the at least one signal is a clock signal.

10. The method of claim 8 wherein the at least one signal is at least one of a read data signal and a read strobe signal.

11. The method of claim 8, wherein the write signal is a write strobe signal, the method further comprising:
detecting a preamble of the write strobe signal to determine the time interval.

12. A buffer circuit for use in a memory module coupled to a memory controller via a memory bus, the memory bus including a set of control/address signal lines and a plurality of sets of data/strobe signal lines, the memory module including a plurality of memory devices organized in groups and a module controller coupled to the memory controller via the set of control/address signal lines, comprising:
a time interval determination circuit to determine a time interval between receiving a first signal from the module controller and receiving a second signal from the memory bus; and
a delay circuit to time transmission of data/strobe signals received from a respective group of the plurality of memory devices to the memory controller via a respective set of the plurality of sets of data/strobe signal lines according to the time interval.

13. The buffer circuit of claim 12 wherein the buffer further comprises receiver circuits to receive corresponding ones of the module control signals, each receiver circuit including a metastability detection circuit to detect metastability condition in the corresponding module control signal.

14. The buffer circuit of claim 12 wherein the buffer circuit further comprises at least one signal adjustment circuit to adjust one or more the module control signals to mitigate metastability condition in the module control signals.

15. The buffer circuit of claim 12, wherein the first signal is an enable signal to enable a write data path in the buffer circuit.

16. The buffer circuit of claim 15, wherein the second signal is a write strobe signal.

17. The buffer circuit of claim 15, wherein the second signal has a preamble, and wherein the time interval determination circuit includes a preamble detector to detect the preamble of the second signal.

18. The buffer circuit of claim 15, wherein the time interval determination circuit further includes a counter to count a number of clock cycles between receipt of the first signal and detection of the preamble of the second signal.

19. The buffer circuit of claim 12, further comprising:
a clock regeneration circuit to receive a clock signal from the module controller and to regenerate a regenerated clock signal according to the time interval.

20. The buffer circuit of claim 12, wherein the buffer circuit is coupled to a respective group of the plurality of memory devices on the memory module, and wherein the buffer circuit further comprises a clock regeneration circuit to receive a clock signal from the module controller and to provide a regenerated clock signal to the respective group of the plurality of memory devices.

* * * * *